US012626887B2

(12) United States Patent
Lyndaker et al.

(10) Patent No.: US 12,626,887 B2
(45) Date of Patent: May 12, 2026

(54) SYSTEMS AND METHODS FOR RADIOFREQUENCY SIGNAL GENERATOR-BASED CONTROL OF IMPEDANCE MATCHING SYSTEM

(71) Applicant: Lam Research Corporation, Fremont, CA (US)

(72) Inventors: Bradford J. Lyndaker, Lowville, NY (US); Alexei Marakhtanov, Albany, CA (US); Felix Leib Kozakevich, Sunnyvale, CA (US); David Hopkins, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 600 days.

(21) Appl. No.: 18/012,962

(22) PCT Filed: Nov. 9, 2021

(86) PCT No.: PCT/US2021/058649
§ 371 (c)(1),
(2) Date: Dec. 26, 2022

(87) PCT Pub. No.: WO2022/103765
PCT Pub. Date: May 19, 2022

(65) Prior Publication Data
US 2023/0253185 A1 Aug. 10, 2023

Related U.S. Application Data

(60) Provisional application No. 63/113,818, filed on Nov. 13, 2020.

(51) Int. Cl.
*H01J 37/32* (2006.01)
*H03H 7/38* (2006.01)

(52) U.S. Cl.
CPC ......... *H01J 37/32183* (2013.01); *H03H 7/38* (2013.01); *H01J 37/32091* (2013.01);
(Continued)

(58) Field of Classification Search
None
See application file for complete search history.

(56) References Cited

U.S. PATENT DOCUMENTS 10,504,744 B1 * 12/2019 Yanagawa ......... H01J 37/32082
10,903,051 B2 * 1/2021 Kon .................. H01J 37/32568
(Continued)

FOREIGN PATENT DOCUMENTS

JP 2020178099 A 10/2020
KR 1020170040001 A 4/2017

OTHER PUBLICATIONS

PCT Application No. PCT/US2021/058649, International Search Report and Written Opinion, Mailed on Mar. 3, 2022.

*Primary Examiner* — Srinivas Sathiraju
(74) *Attorney, Agent, or Firm* — Polygon IP, LLP

(57) ABSTRACT

An RF signal supply system for plasma generation includes an RF signal generator, an impedance matching system, and a control module. The RF signal generator includes a control system. The impedance matching system has an input connected to an output of the RF signal generator, an output connected to a plasma processing system, a gamma control capacitor, and a frequency control capacitor. The control module is connected in data communication with each of the RF signal generator and the impedance matching system. The control module is programmed to transmit control signals to the impedance matching system based on corresponding data received from the control system of the RF signal generator, where the control signals direct control of the gamma control capacitor and the frequency control capacitor. The control module is also programmed to trans- (Continued)

mit data received from the impedance matching system to the control system of the RF signal generator.

17 Claims, 14 Drawing Sheets

(52) U.S. Cl.
  CPC ... *H01J 37/321* (2013.01); *H01J 2237/24564* (2013.01); *H01J 2237/3345* (2013.01)

(56) References Cited

U.S. PATENT DOCUMENTS

| | | | | |
|---|---|---|---|---|
| 2008/0160775 A1* | 7/2008 | Dhindsa | ............ | H01J 37/32091 |
| | | | | 156/345.48 |
| 2013/0213934 A1* | 8/2013 | Valcore, Jr. | ............... | B44C 1/22 |
| | | | | 216/67 |
| 2013/0214683 A1* | 8/2013 | Valcore, Jr. | ....... | H01J 37/32146 |
| | | | | 315/111.21 |
| 2014/0009073 A1* | 1/2014 | Valcore, Jr. | ....... | H01J 37/32082 |
| | | | | 315/183 |
| 2014/0076713 A1* | 3/2014 | Valcore, Jr. | ....... | H01J 37/32174 |
| | | | | 422/108 |
| 2014/0172335 A1* | 6/2014 | Valcore, Jr. | ............ | G01R 19/25 |
| | | | | 702/65 |
| 2014/0195033 A1* | 7/2014 | Lyndaker | .......... | H01J 37/32183 |
| | | | | 700/121 |
| 2017/0032945 A1* | 2/2017 | Valcore, Jr. | ....... | H01J 37/32174 |
| 2017/0117869 A1* | 4/2017 | Leeser | ............. | H01J 37/32183 |
| 2018/0005802 A1* | 1/2018 | Chen | ................. | H01J 37/32174 |
| 2018/0025891 A1* | 1/2018 | Marakhtanov | .... | H01J 37/32568 |
| | | | | 438/714 |
| 2018/0309424 A1* | 10/2018 | Leeser | ...................... | H03H 7/38 |
| 2019/0027342 A1* | 1/2019 | Howald | ............ | H01J 37/32155 |
| 2019/0318919 A1* | 10/2019 | Lyndaker | .......... | H01J 37/32935 |
| 2019/0355554 A1* | 11/2019 | Ulrich | ................. | H01L 21/0262 |
| 2019/0385822 A1* | 12/2019 | Marakhtanov | .... | H01J 37/32183 |
| 2020/0335306 A1* | 10/2020 | Kon | ......................... | H05H 1/46 |
| 2023/0059495 A1* | 2/2023 | Marakhtanov | .... | H01J 37/32568 |
| 2023/0223242 A1* | 7/2023 | Marakhtanov | ...... | H01L 21/3065 |
| | | | | 438/712 |
| 2023/0230804 A1* | 7/2023 | Bhowmick | ....... | H01L 21/68742 |
| | | | | 315/111.21 |
| 2023/0245874 A1* | 8/2023 | Marakhtanov | .... | H01J 37/32165 |
| | | | | 315/111.21 |
| 2023/0253184 A1* | 8/2023 | Marakhtanov | .... | H01J 37/32091 |
| | | | | 315/111.21 |
| 2023/0253185 A1* | 8/2023 | Lyndaker | .......... | H01J 37/32183 |
| | | | | 315/111.21 |
| 2023/0274914 A1* | 8/2023 | Marakhtanov | .... | H01J 37/32165 |
| | | | | 361/234 |

* cited by examiner

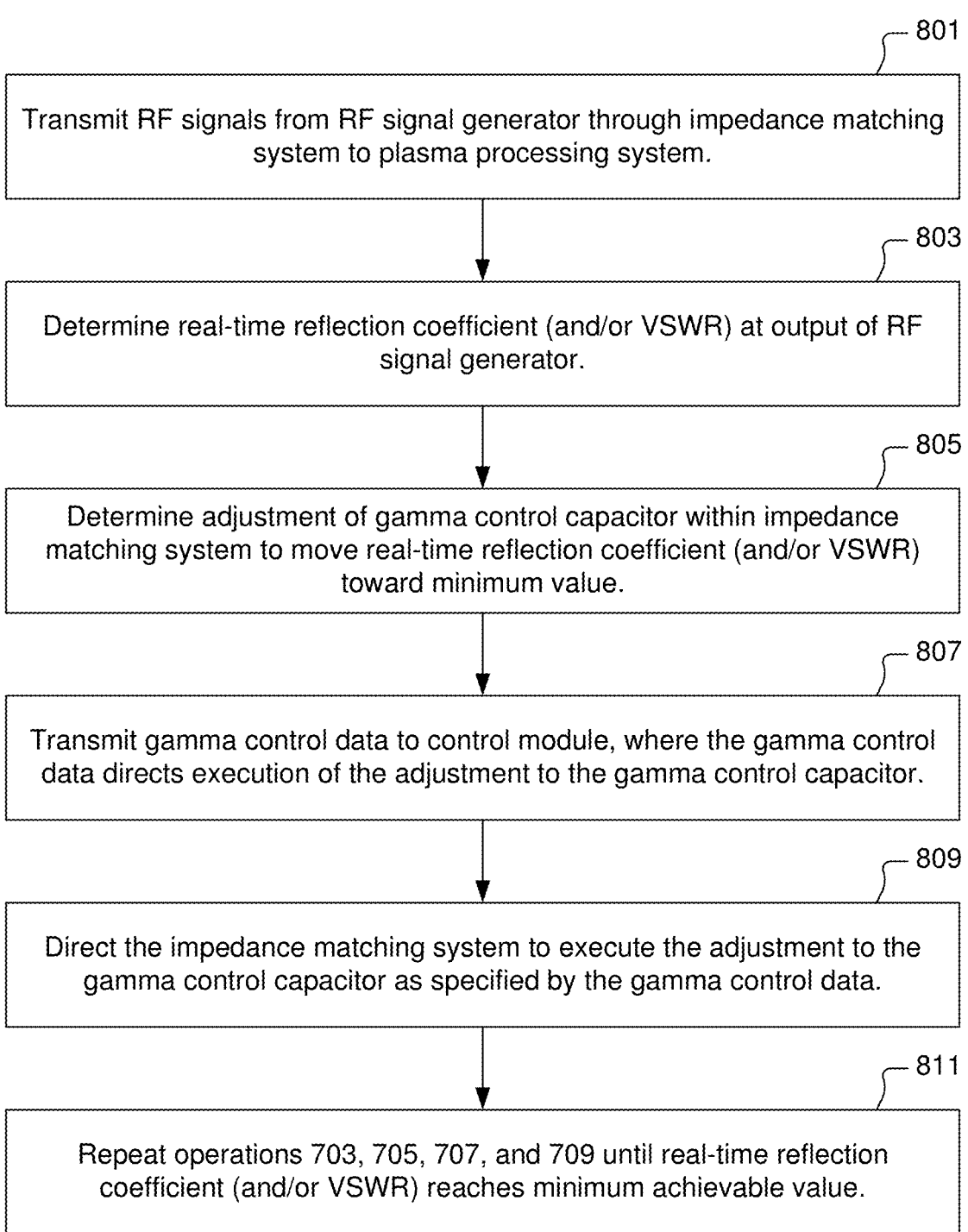

801

Transmit RF signals from RF signal generator through impedance matching system to plasma processing system.

803

Determine real-time reflection coefficient (and/or VSWR) at output of RF signal generator.

805

Determine adjustment of gamma control capacitor within impedance matching system to move real-time reflection coefficient (and/or VSWR) toward minimum value.

807

Transmit gamma control data to control module, where the gamma control data directs execution of the adjustment to the gamma control capacitor.

809

Direct the impedance matching system to execute the adjustment to the gamma control capacitor as specified by the gamma control data.

811

Repeat operations 703, 705, 707, and 709 until real-time reflection coefficient (and/or VSWR) reaches minimum achievable value.

Fig. 8A

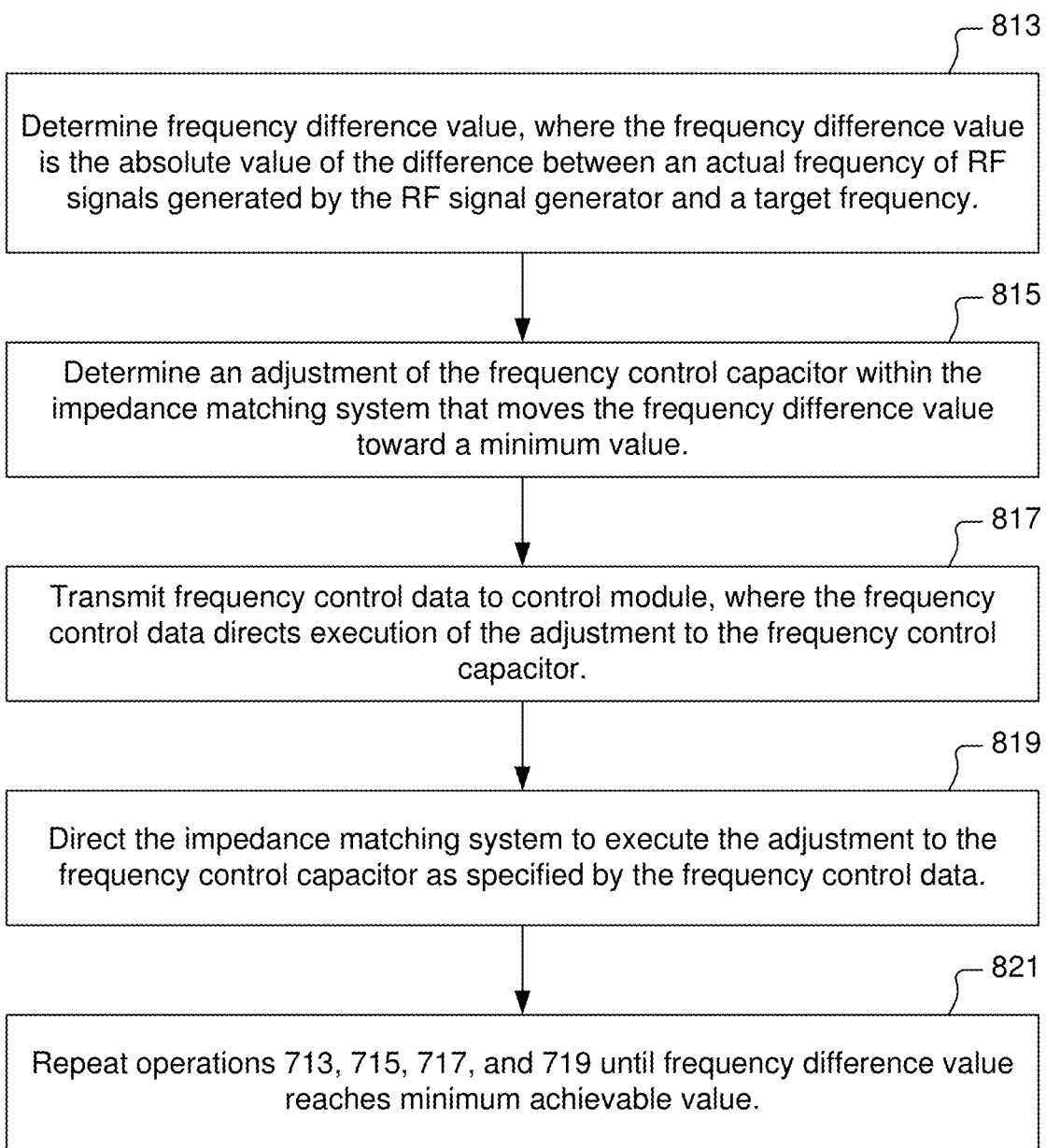

813

Determine frequency difference value, where the frequency difference value is the absolute value of the difference between an actual frequency of RF signals generated by the RF signal generator and a target frequency.

815

Determine an adjustment of the frequency control capacitor within the impedance matching system that moves the frequency difference value toward a minimum value.

817

Transmit frequency control data to control module, where the frequency control data directs execution of the adjustment to the frequency control capacitor.

819

Direct the impedance matching system to execute the adjustment to the frequency control capacitor as specified by the frequency control data.

821

Repeat operations 713, 715, 717, and 719 until frequency difference value reaches minimum achievable value.

Fig. 8B

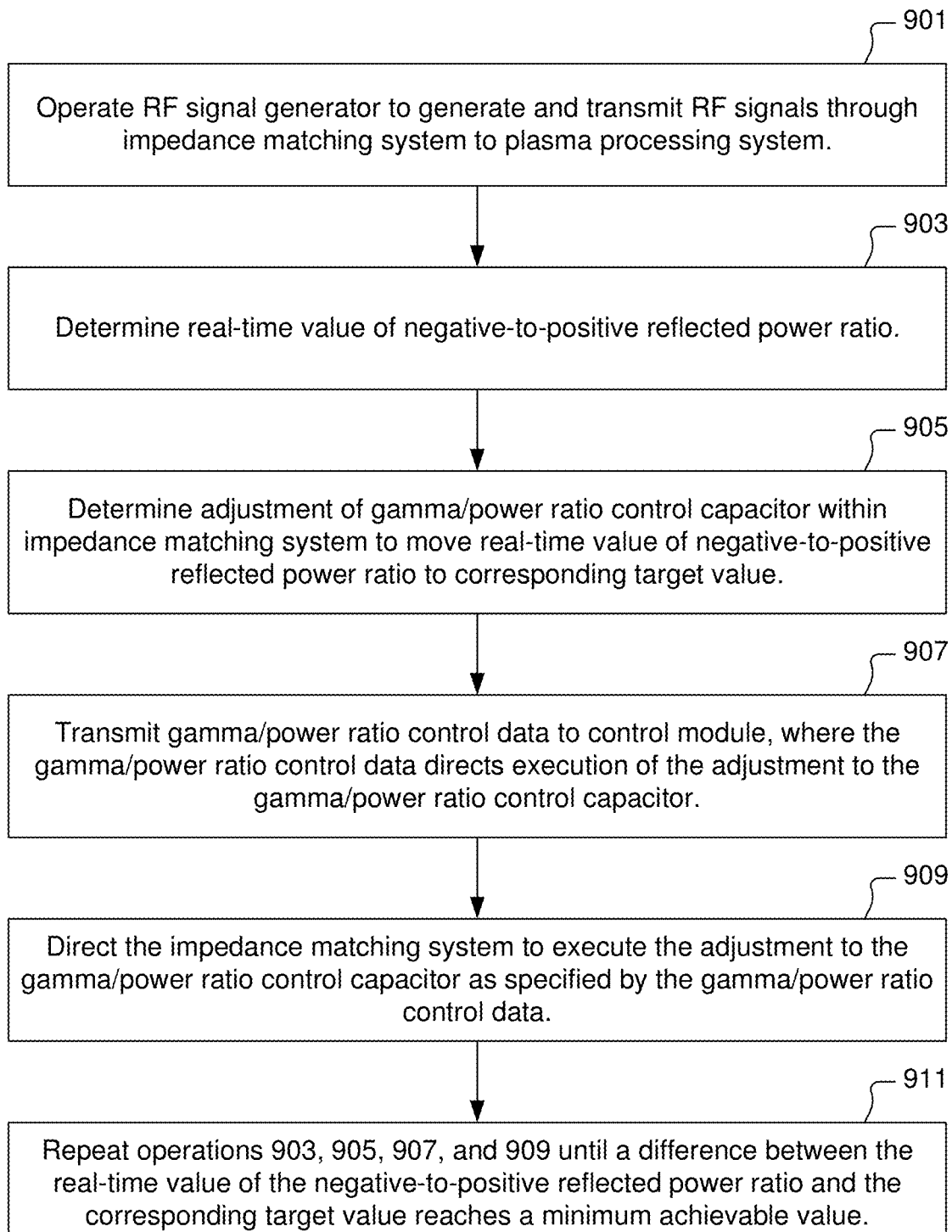

901

Operate RF signal generator to generate and transmit RF signals through impedance matching system to plasma processing system.

903

Determine real-time value of negative-to-positive reflected power ratio.

905

Determine adjustment of gamma/power ratio control capacitor within impedance matching system to move real-time value of negative-to-positive reflected power ratio to corresponding target value.

907

Transmit gamma/power ratio control data to control module, where the gamma/power ratio control data directs execution of the adjustment to the gamma/power ratio control capacitor.

909

Direct the impedance matching system to execute the adjustment to the gamma/power ratio control capacitor as specified by the gamma/power ratio control data.

911

Repeat operations 903, 905, 907, and 909 until a difference between the real-time value of the negative-to-positive reflected power ratio and the corresponding target value reaches a minimum achievable value.

Fig. 9

SYSTEMS AND METHODS FOR RADIOFREQUENCY SIGNAL GENERATOR-BASED CONTROL OF IMPEDANCE MATCHING SYSTEM

This application is a national stage filing of and claims priority, under 35 U.S.C. § 371, to PCT/US2021/058649, filed on Nov. 9, 2021, which claims the benefit of U.S. Provisional Application No. 63/113,818, filed on Nov. 13, 2020. The entire disclosure of each application referenced above is incorporated herein by reference.

BACKGROUND

1. Field of the Disclosure

The present disclosure relates to semiconductor device fabrication.

2. Description of the Related Art

In the fabrication of semiconductor devices such as integrated circuits, memory cells, and the like, a series of manufacturing operations are performed to define features on a semiconductor wafer ("wafers" hereafter). The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

Many modern semiconductor chip fabrication processes include generation of a plasma from which ions and/or radical constituents are derived for use in either directly or indirectly effecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency of the RF power applied, magnitude of the RF power applied, and temporal manner in which the RF power is applied, among others. Therefore, it is of interest to understand, monitor, and/or control some of the process parameters that may affect the characteristics of the generated plasma, particularly with regard to generation and delivery of the RF power to the plasma generation region. It is within this context that the present disclosure arises.

SUMMARY

In an example embodiment, an RF signal supply system for plasma generation is disclosed. The RF signal supply system includes an RF signal generator configured to generate RF signals and transmit the RF signals through an output of the RF signal generator. The RF signal generator includes a control system. The RF signal supply system also includes an impedance matching system that has an input connected to the output of the RF signal generator. The impedance matching system has an output connected to an RF feed structure of a plasma processing system. The impedance matching system includes a first control capacitor connected between the input of the impedance matching system and a reference potential. The impedance matching system also includes a second control capacitor connected between a first terminal of a first inductor and the reference potential. The first inductor has a second terminal connected to the output of the impedance matching system. The RF signal supply system also includes a control module connected in data communication with each of the RF signal generator and the impedance matching system. The control module is programmed to transmit control signals to the impedance matching system based on corresponding data received from the control system of the RF signal generator. The control signals direct control of the first control capacitor and the second control capacitor. The control module is also programmed to transmit data to the control system of the RF signal generator based on corresponding data or signals received from the impedance matching system.

In another example embodiment, a method is disclosed for optimizing transmission of RF power to a plasma. The method includes transmitting RF signals from an RF signal generator through an impedance matching system to a plasma processing system. The method also includes determining a real-time value of an indicator parameter indicative of an efficacy of transmission of radiofrequency power to the plasma processing system. In some embodiments, the indicator parameter is a reflection coefficient, or a voltage standing wave ratio, or a negative-to-positive reflected power ratio, or a negative-to-positive delivered power ratio. The method also includes determining an adjustment of a first control capacitor within the impedance matching system to adjust the real-time value of the indicator parameter with respect to a corresponding target value. The method also includes transmitting control data to effect execution of the determined adjustment of the first control capacitor in the impedance matching system. The method also includes repeating: 1) determining the real-time value of the indicator parameter, 2) determining the adjustment of the first control capacitor within the impedance matching system to adjust the real-time value of the indicator parameter with respect to the corresponding target value, and 3) transmitting the control data to the control module to effect execution of the determined adjustment of the first control capacitor, until a difference between the real-time value of the indicator parameter and the corresponding target value has reached a minimum achievable value.

The method also includes determining a frequency difference value, where the frequency difference value is an absolute value of a difference between an actual frequency of RF signals generated by the RF signal generator and a target frequency. The method also includes determining an adjustment of a second control capacitor within the impedance matching system that adjusts the frequency difference value toward a minimum value. The method also includes transmitting control data to effect execution of the determined adjustment of the second control capacitor. The method further includes repeating: 1) determining the frequency difference value, 2) determining the adjustment of the second control capacitor within the impedance matching system that adjusts the frequency difference value toward the minimum value, and 3) transmitting control data to effect execution of the determined adjustment of the second control capacitor, until the frequency difference value has reached a minimum achievable value.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 8A shows a flowchart of a method for optimizing transmission of RF power to a plasma, in accordance with some embodiments.

FIG. 8B shows a flowchart of a continuation of the method of FIG. 8A for optimizing transmission of RF power to the plasma, in accordance with some embodiments.

FIG. 9 shows a flowchart of a method for optimizing transmission of RF power to a plasma, in accordance with some embodiments.

DETAILED DESCRIPTION

Figures 1A, 1B:
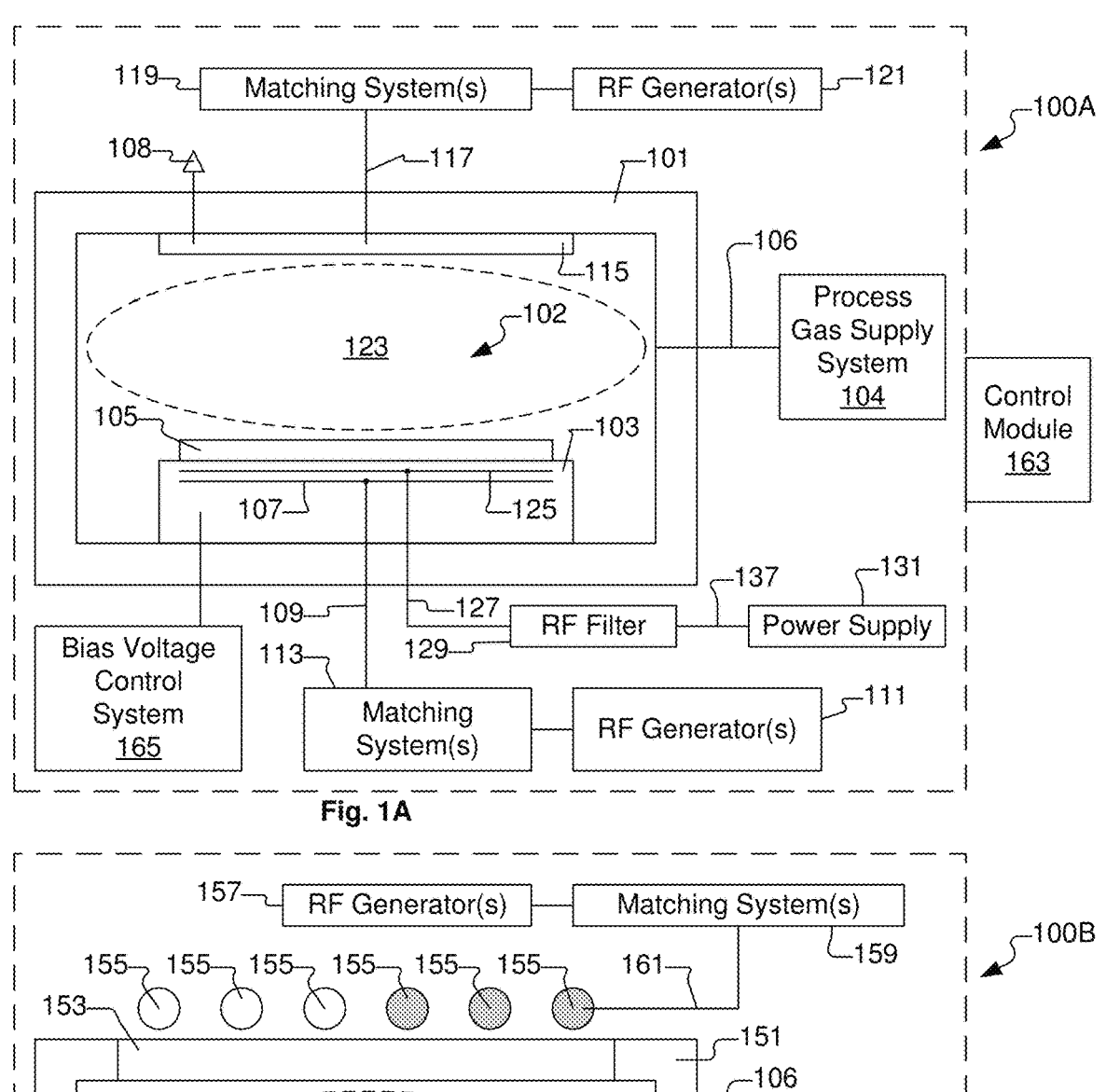
FIG. 1A shows an example vertical cross-section diagram of a CCP processing system, in accordance with some embodiments of the present disclosure.
FIG. 1B shows an example vertical cross-section diagram of an ICP processing system, in accordance with some embodiments of the present disclosure.

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

In the semiconductor industry, semiconductor substrates can undergo fabrication operations in various types of plasma chambers, such as capacitively coupled plasma (CCP) processing chambers and inductively coupled plasma (ICP) plasma processing chambers. In both CCP and ICP processing chambers, radiofrequency (RF) power is used to energize a process gas to transform the process gas into a plasma within a plasma processing region to which the substrate is exposed. Reactive species and/or charged species within the plasma interact with the substrate to modify a condition of the substrate, such as by modifying a material present on the substrate, or by depositing material on the substrate, or by removing/etching material from the substrate, by way of example. The CCP and ICP processing chambers can be equipped with one or more electrodes that receive RF power for generating the plasma within the plasma processing region. Also, the CCP and ICP processing chambers can be equipped with one or more electrodes that receive RF power and/or direct current (DC) power to generate a bias voltage at the substrate location for attracting charged species from the plasma toward the substrate. Also, in some embodiments, the CCP and ICP processing chambers can be equipped with one or more electrically powered components, such as a heater assembly, that receive electrical power from one or more power supplies, where each of the one or more power supplies is either a DC power supply or an AC (alternating current) power supply.

In some embodiments, RF signals and/or electrical (non-RF) signals present on RF electrical transmission paths connected to the CCP and/or ICP processing chamber(s) can provide an indication of how much RF power is actually being transmitted to the plasma load within the CCP and/or ICP processing chamber(s). In various embodiments, the RF signals and/or electrical (non-RF) signals present on RF electrical transmission paths connected to the CCP and/or ICP processing chambers can be measured directly, or can be calculated, or can be used to calculate values of other parameters that provide an indication of how much RF power is actually being transmitted to the plasma load within the CCP and/or ICP processing chamber(s). It is desirable to maximize the amount of forward RF power that is actually transmitted to the plasma load within the CCP and/or ICP processing chamber(s).

In some embodiments disclosed herein, the RF signals and/or electrical (non-RF) signals present on at least one RF electrical transmission path connected to the CCP and/or ICP processing chamber(s) can be used as a feedback signal to optimize forward RF power transmission to the plasma load within the CCP and/or ICP processing chamber(s). In some embodiments disclosed herein, this feedback signal can be used to determine an adjustment in the control of an RF signal generator to optimize forward RF power transmission to the plasma load. In some embodiments disclosed herein, this feedback signal can be used to determine an adjustment in an impedance matching system, connected between the RF signal generator and the CCP and/or ICP processing chamber(s), to optimize forward RF power transmission to the plasma load. And, in some embodiments disclosed herein, this feedback signal can be used to both determine an adjustment in the control of the RF signal generator and determine an adjustment in the impedance matching system to optimize forward RF power transmission to the plasma load within the CCP and/or ICP processing chamber(s).

FIG. 1A shows an example vertical cross-section diagram of a CCP processing system 100A, in accordance with some embodiments of the present disclosure. The CCP processing system 100A includes a chamber 101 within which a plasma processing region 102 exists. Within the plasma processing region 102, a plasma 123 (represented by the dashed oval region) is generated in exposure to a substrate 105 to effect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105. In some embodiments, the substrate 105 is a semiconductor wafer undergoing a fabrication procedure. However, it should be understood that in various embodiments, the substrate 105 can be essentially any type of substrate that is subjected to a plasma-based fabrication process. For example, in some embodiments, the substrate 105 as referred to herein can be a substrate formed of silicon, sapphire, GaN, GaAs or SiC, or other substrate materials, and can include glass panels/substrates, metal foils, metal sheets, polymer materials, or the like. Also, in various embodiments, the substrate 105 as referred to herein may vary in form, shape, and/or size. For example, in some embodiments, the substrate 105 referred to herein may correspond to a 200 mm (millimeters) diameter semiconductor wafer, a 300 mm diameter semiconductor wafer, or a 450 mm diameter semiconductor wafer, among other semiconductor wafer sizes. Also, in some embodiments, the substrate 105 referred to herein may correspond to a non-circular substrate, such as a rectangular substrate for a flat panel display, or the like, among other shapes.

The plasma processing region 102 within the CCP processing chamber 101 is connected to a process gas supply system 104, such that one or more process gas(es) can be supplied in a controlled manner to the plasma processing region 102, as represented by line 106. It should be understood that the process gas supply system 104 includes one or more process gas sources and an arrangement of valves and mass flow controllers to enable provision of the one or more process gas(es) to the plasma processing region 102 with a controlled flow rate and with a controlled flow time. Also, in various embodiments, the one or more process gas(es) are delivered to the plasma processing region 102 in both a temporally controlled manner and a spatially controlled manner relative to the substrate 105. In various embodiments, the CCP processing system 100A operates by having the process gas supply system 104 deliver one or more process gases into the plasma processing region 102, and by applying RF power to the one or more process gases to transform the one or more process gases into the plasma 123 in exposure to the substrate 105, in order to cause a change in material or surface condition on the substrate 105.

The CCP processing chamber 101 includes a substrate support structure 103 upon which the substrate 105 is positioned and supported during processing operations. In some embodiments, an electrode 107 is disposed within the substrate support structure 103 to provide for transmission of RF power from the electrode 107 through the plasma processing region 102 to generate the plasma 123 and/or control ion energy. The electrode 107 is connected to receive RF power through an RF feed structure 109, which is connected to one or more RF power generator(s) 111 by way of one or more impedance matching system(s) 113. The RF feed structure 109 is an electrically conductive member. In some embodiments, the RF feed structure 109 includes an electrically conductive rod. The impedance matching system(s) 113 include an arrangement of capacitors and inductors configured to ensure that an impedance seen by the RF power generator(s) 111 at the input of the impedance matching system(s) 113 is sufficiently close to an output impedance for which the RF power generator(s) 111 is designed to operate (usually 50 Ohm), so that RF power generated and transmitted by the RF power generator(s) 111 will be transmitted into the plasma processing region 102 in an efficient manner, e.g., without unacceptable or undesirable reflection.

Also, in some embodiments, the CCP processing chamber 101 can include an upper electrode 115. In various embodiments, the upper electrode 115 can provide either an electrical ground electrode or can be used to transmit RF power into the plasma processing region 102. For example, in some embodiments, the upper electrode 115 is connected to a reference potential 108, e.g., reference ground potential, such that the upper electrode 115 provides a return path for RF signals transmitted into the plasma processing region 102 from the electrode 107. Alternatively, in some embodiments, the upper electrode 115 is connected to receive RF power through an RF feed structure 117, which is connected to one or more RF power generator(s) 121 by way of one or more impedance matching system(s) 119. The impedance matching system(s) 119 include an arrangement of capacitors and inductors configured to ensure that an impedance seen by the RF power generator(s) 121 at the input of the impedance matching system(s) 119 is sufficiently close to an output impedance for which the RF powers generator(s) 121 is designed to operate (usually 50 Ohm), so that RF power generated and transmitted by the RF power generator(s) 121 will be transmitted into the plasma processing region 102 in an efficient manner, e.g., without unacceptable or undesirable reflection.

In some embodiments, a heater assembly 125 is disposed within the substrate support structure 103 to provide temperature control of the substrate 105. The heater assembly 125 is electrically connected to receive electrical power through an electrical connection 127, where the electrical power is supplied from a power supply 131 through an electrical connection 137 to an RF filter 129, and through the RF filter 129 to the electrical connection 127. In some embodiments, the power supply 131 is an alternating current (AC) power supply. In some embodiments, the power supply 131 is a direct current (DC) power supply. In some embodiments, the heater assembly 125 includes a plurality of electrical resistance heating elements. The RF filter 129 is configured to prevent RF power from entering the power supply 131, while allowing transmission of electrical current between the power supply 131 and the electrical connection 127.

Also, in some embodiments, a bias voltage control system 165 is connected to the substrate support structure 103 within the CCP processing chamber 101. In some embodiments, the bias voltage control system 165 is connected to one or more bias voltage electrodes disposed within the substrate support structure 103 to control a bias voltage present at the location of the substrate 105. The bias voltage can be controlled to attract charged constituents of the plasma 123 toward the substrate 105 and thereby control energy and directionality of the charged constituents of the plasma 123. For example, the bias voltage control system 165 can be operated to accelerate ions in the plasma 123 toward the substrate 105 to perform an anisotropic etch on the substrate 105.

FIG. 1B shows an example vertical cross-section diagram of an ICP processing system 100B, in accordance with some embodiments of the present disclosure. The ICP processing system 100B can also be referred to as a transformer coupled plasma (TCP) processing system. For ease of discussion herein, ICP processing system will be used to refer to both ICP and TCP processing systems. The ICP processing system 100B includes a chamber 151 within which a plasma processing region 152 exists. Within the plasma processing region 152, the plasma 123 (represented by the dashed oval region) is generated in exposure to the substrate 105 to effect a change to the substrate 105 in a controlled manner. In various fabrication processes, the change to the substrate 105 can be a change in material or surface condition on the substrate 105. For example, in various fabrication processes, the change to the substrate 105 can include one or more of etching of a material from the substrate 105, deposition of a material on the substrate 105, or modification of material present on the substrate 105. It should be understood that the ICP processing chamber 151 can be any type of ICP processing chamber in which RF power is transmitted from a coil 155 disposed outside the ICP processing chamber 151 to a process gas within the ICP processing chamber 151 to generate the plasma 123 within the plasma processing region 152. An upper window structure 153 is provided to allow for transmission of RF power from the coil 155 through the upper window structure 153 and into the plasma processing region 152 of the ICP processing chamber 151.

The plasma processing region 152 within the ICP processing chamber 151 is connected to the process gas supply system 104, such that one or more process gas(es) can be supplied in a controlled manner to the plasma processing region 152, as represented by line 106. The ICP processing system 100B operates by having the process gas supply system 104 flow one or more process gases into the plasma processing region 152, and by applying RF power from the coil 155 to the one or more process gases to transform the one or more process gases into the plasma 123 in exposure to the substrate 105, in order to cause a change in material or surface condition on the substrate 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can have essentially any configuration that is suitable for transmitting RF power through the upper window structure 153 and into the plasma processing region 152. In various embodiments, the coil 155 can have any number of turns and any cross-section size and shape (circular, oval, rectangular, trapezoidal, etc.) as appropriate to provide the desired transmission of RF power through the upper window structure 153 into the plasma processing region 152.

The coil 155 is connected through an RF power supply structure 161 to one or more RF power generator(s) 157 by way of one or more impedance matching system(s) 159. The impedance matching system(s) 159 includes an arrangement of capacitors and/or inductors configured to ensure that an impedance seen by the RF power generator(s) 157 at the input of the impedance matching system(s) 159 is sufficiently close to an output impedance for which the RF power generator(s) 157 is designed to operate (usually 50 Ohms), so that RF power supplied to the coil 155 by the RF power generator(s) 157 will be transmitted into the plasma processing region 152 in an efficient manner, i.e., without unacceptable or undesirable reflection. Also, in some embodiments, the ICP processing chamber 151 can include the electrode 107, the RF feed structure 109, the impedance matching system(s) 113, and the RF power generator(s) 111, as previously described with regard to FIG. 1A.

Also, in some embodiments, the ICP processing chamber 151 can include the heater assembly 125 disposed within the substrate support structure 103 to provide temperature control of the substrate 105. As described with regard to the CCP processing chamber 101 of FIG. 1A, the heater assembly 125 of the ICP processing chamber 151 is electrically connected to receive electrical power through the electrical connection 127, where the electrical power is supplied from the power supply 131 through the electrical connection 137 to the RF filter 129, and through the RF filter 129 to the electrical connection 127. Also, in some embodiments, the bias voltage control system 165 is connected to the substrate support structure 103 within the ICP processing chamber 151.

A control module 163 is configured and connected to provide for control of plasma process operations performed by the CCP processing system 100A and by the ICP processing system 100B. In some embodiments, the control module 163 is implemented as a combination of computer hardware and software. The control module 163 can be configured and connected to provide for control of essentially any system or component associated with the CCP processing system 100A and/or the ICP processing system 100B. For example, the control module 163 can be configured and connected to control the process gas supply system 104, the RF signal generator(s) 111, the impedance matching system(s) 113, the RF signal generator(s) 121, the impedance matching system(s) 119, the power supply 131 for the heater assembly 125, the bias voltage control system 165, the RF signal generator(s) 157, the impedance matching system(s) 159, and/or any other system or component.

Also, the control module 163 can be connected and configured to receive signals from various components, sensors, and monitoring devices associated with the CCP processing system 100A and the ICP processing system 100B. For example, the control module 163 can be connected and configured to receive electrical measurement signals, e.g., voltage and/or current, and RF measurement signals from one or more of the substrate support structure 103, the RF feed structure 109, the RF feed structure 117, the RF feed structure 161, the electrical connection 127, and from any other structure or component within the CCP processing system 100A and the ICP processing system 100B. And, the control module 163 can be connected and configured to receive temperature and pressure measurement signals from within the plasma processing regions 102 and 152 of the CCP processing chamber 101 and the ICP processing chamber 151, respectively. Also, in some embodiments, the control module 163 can be configured and connected to receive, process, and respond to an optically measured signal within the CCP processing chamber 101 and the ICP processing chamber 151.

It should be understood that the control module 163 can be connected and configured to control essentially any active device, i.e., controllable device, associated with operation of the CCP processing system 100A and the ICP processing system 100B. And, it should be understood that the control module 163 can be connected and configured to monitor essentially any physical and/or electrical state, condition, and/or parameter at essentially any location within the CCP processing system 100A and the ICP processing system 100B. The control module 163 can also be configured to direct operation of various components in a synchronous and scheduled manner to perform a prescribed plasma processing operation on the substrate 105. For example, the control module 163 can be configured to operate the CCP processing system 100A and the ICP processing system 100B by executing process input and control instructions/programs. The process input and control instructions/programs may include process recipes having time-dependent directions for parameters such as power levels, timing parameters, process gases, mechanical movement of the substrate 101, etc., as needed to obtain a desired process result on the substrate 105.

Figure 1C:
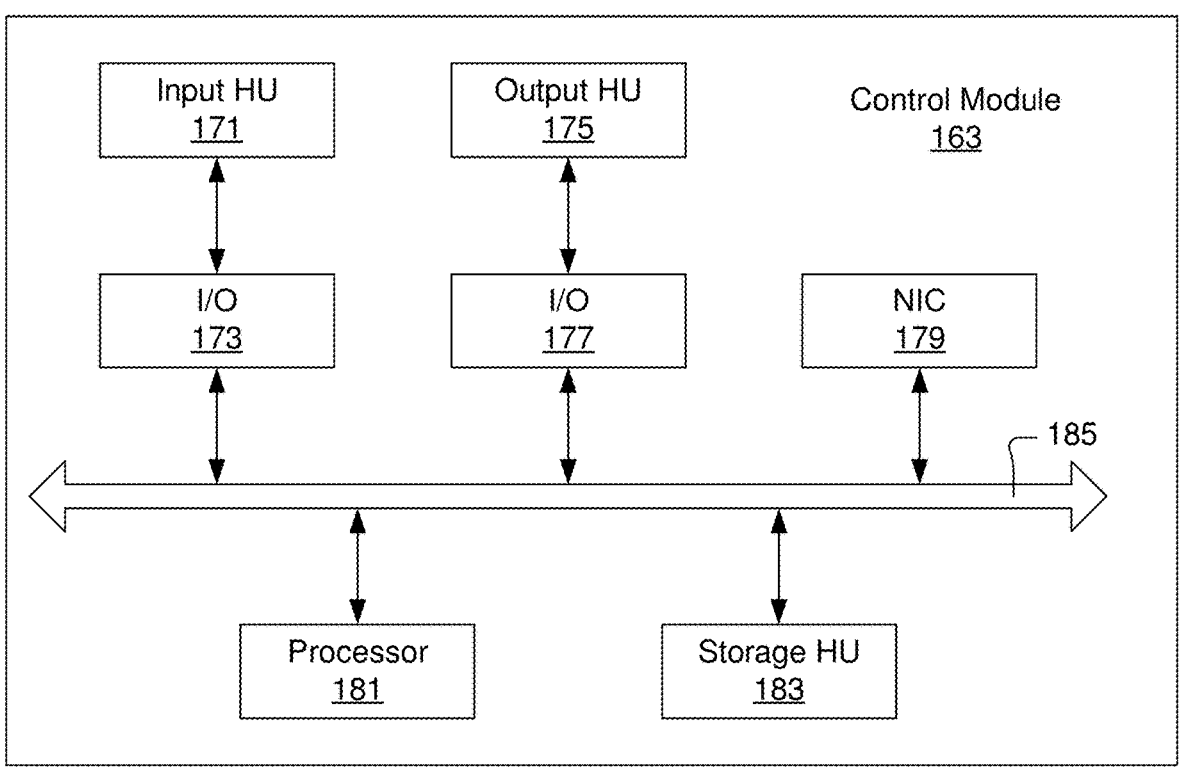
FIG. 1C shows a diagram of the control module, in accordance with some example embodiments.

FIG. 1C shows a diagram of the control module 163, in accordance with some example embodiments. The control module 163 includes a processor 181, a storage hardware unit (HU) 183 (e.g., memory), an input HU 171, an output HU 175, an input/output (I/O) interface 173, an I/O interface 177, a network interface controller (NIC) 179, and a data communication bus 185. The processor 181, the storage HU 183, the input HU 171, the output HU 175, the I/O interface 173, the I/O interface 177, and the NIC 179 are in data communication with each other by way of the data communication bus 185. Examples of the input HU 171 include a mouse, a keyboard, a stylus, a data acquisition system, a data acquisition card, etc. Examples of the output HU 175 include a display, a speaker, a device controller, etc. Examples of the NIC 179 include a network interface card, a network adapter, etc. In various embodiments, the NIC 179 is configured to operate in accordance with one or more communication protocols and associate physical layers, such as Ethernet and/or EtherCAT, among others. Each of the I/O interfaces 173 and 177 is defined to provide compatibility between different hardware units coupled to the I/O interface. For example, the I/O interface 173 can be defined to convert a signal received from the input HU 171 into a form, amplitude, and/or speed compatible with the data communication bus 185. Also, the I/O interface 177 can be defined to convert a signal received from the data communication bus 185 into a form, amplitude, and/or speed compatible with the output HU 175. Although various operations described herein are performed by the processor 181 of the control module 163, it should be understood that in some embodiments various operations can be performed by multiple processors of the control module 163 and/or by multiple processors of multiple computing systems connected to the control module 163.

Figure 2:
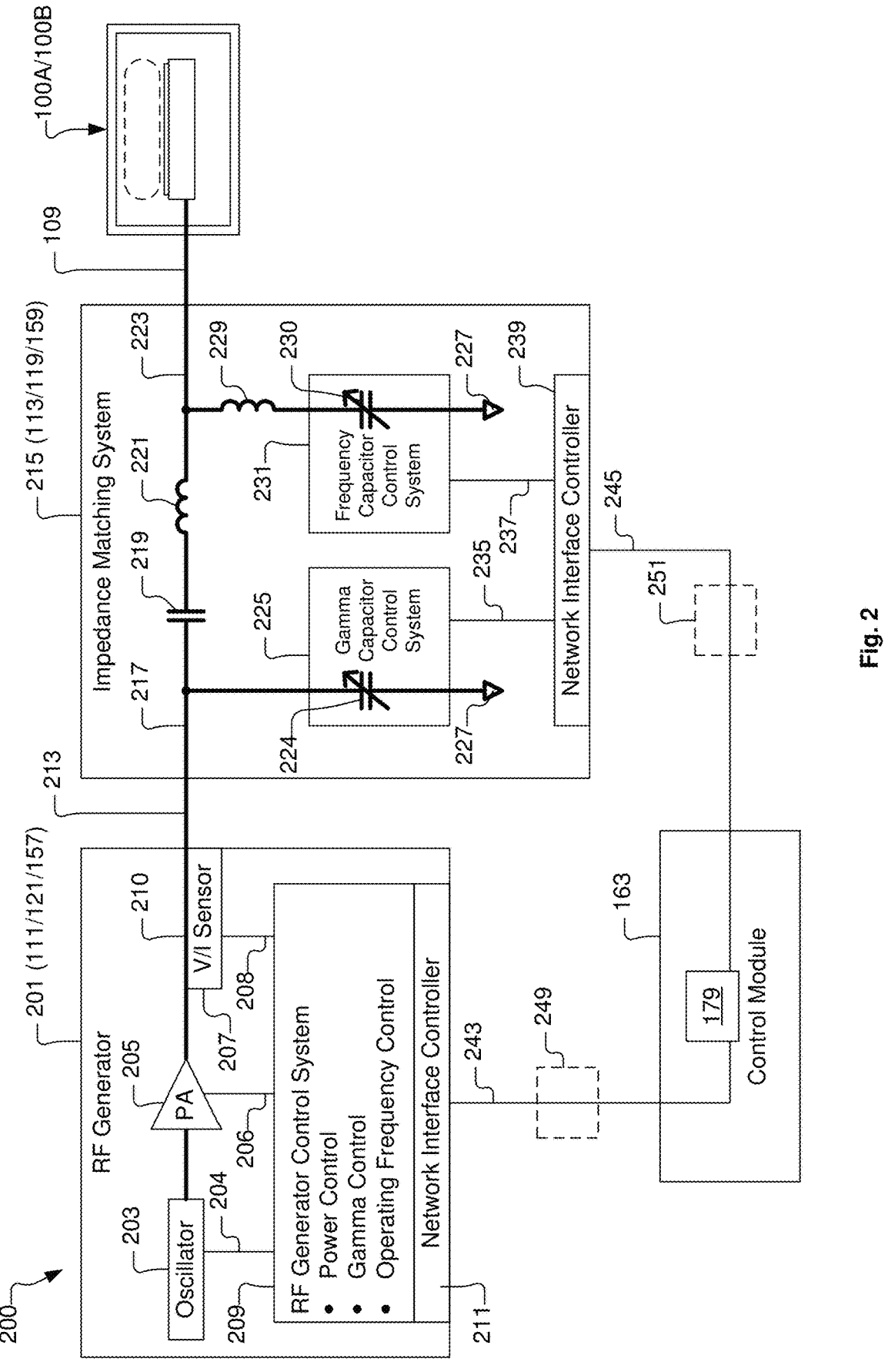
FIG. 2 shows an RF Signal Generator Based Match Control (GBMC) system, in accordance with some embodiments.

FIG. 2 shows an RF Signal Generator Based Match Control (GBMC) system 200, in accordance with some embodiments. The GBMC system 200 includes an RF signal generator 201 connected to supply RF signals through an impedance matching network 215 to the CCP/ICP processing system 100A/100B. For ease of description, the CCP/ICP processing system 100A/100B is referred to hereafter as a plasma processing system 100A/100B. The RF signal generator 201 represents each of the RF signal generators 111, 121, and 157, as described with regard to FIGS. 1A-1B. Also, the impedance matching system 215 represents each of the impedance matching systems 113, 119, and 159, as described with regard to FIGS. 1A-1B. The RF signal generator 201 is configured to generate and transmit RF signals of controlled amplitude and frequency from an output 210 of the RF signal generator 201, through/along an electrical conductor 213, to an input 217 of the impedance matching system 215. The RF signals, having been processed by the impedance matching system 215, then travel from an output 223 of the impedance matching system 215, through/along the RF feed structure 109, to an electrode (e.g., 107, 115, 155) within the plasma processing system 100A/100B. In the case of the CCP processing system 100A, the RF signals travel through the plasma processing region 102 to generate the plasma 123. In the case of the ICP processing system 100B, the RF signals travel through the plasma processing region 152 to generate the plasma 123.

The RF signal generator 201 includes an oscillator 203 for generating RF signals. The oscillator 203 is an electronic circuit that produces a periodic oscillating electrical signal, such a sine wave electrical signal, having a specified frequency within the RF range. In some embodiments, the oscillator 203 is a high-frequency oscillator capable of oscillating within a frequency range extending from about 10 megaHertz (MHz) to about 100 MHz. In some embodiments, the oscillator 203 is a low-frequency oscillator capable of oscillating within a frequency range extending from about 100 kiloHertz (kHz) to about 3 MHz. An output of the oscillator 203 is connected to an input of a power amplifier 205. The power amplifier 205 operates to amplify the RF signals generated by the oscillator 203, and transmit the amplified RF signals through an output of the power amplifier 205 to the output 210 of the RF signal generator 201.

The RF signal generator 201 also includes an RF signal generator control system 209 configured to provide for control of all operational aspects of the RF signal generator 201. In some embodiments, the RF signal generator control system 209 is configured in a similar manner as the control module 163 of the plasma processing system 100A/100B. For example, in some embodiments, the RF signal generator control system 209 includes a processor, a data storage device, an input/output interface, and a data bus through which the processor, the data storage device, and the input/output interface communicate data to and from each other.

The RF signal generator control system 209 is connected to provide for control of the oscillator 203, as indicated by connection 204. The RF signal generator control system 209 is connected to provide for control of the power amplifier 205, as indicated by connection 206. The RF signal generator control system 209 also includes a network interface controller 211 that enables the RF signal generator control system 209 to send data to and receive data from systems outside of the RF signal generator 201. Examples of the network interface controller 211 include a network interface card, a network adapter, etc. In various embodiments, the network interface controller 211 is configured to operate in accordance with one or more network communication protocols and associate physical layers, such as Ethernet and/or EtherCAT, among others.

It should be understood that the RF signal generator control system 209 is connected and configured to control essentially any aspect of the RF signal generator 201. And, it should be understood that the RF signal generator control system 209 can be connected and configured to monitor essentially any physical and/or electrical state, condition, and/or parameter at essentially any location within the RF signal generator 201. The RF signal generator control system 209 is also configured to direct operation of the RF signal generator 201 in accordance with a prescribed algorithm. For example, the RF signal generator control system 209 is configured to operate the RF signal generator 201 by executing input and control instructions/programs. The input and control instructions/programs include a target RF power setpoint and a target frequency setpoint, among other parameters associated with operation and control of the RF signal generator 201.

The RF signal generator 201 also includes a voltage/current (V/I) sensor 207 connected to the output 210 of the RF signal generator 201. The V/I sensor 207 is connected to the RF signal generator control system 209, as shown by connection 208. In this configuration, the V/I sensor 207 provides a real-time measurement of voltage and current present on the output 210 of the RF signal generator 201 to the RF signal generator control system 209. It should be understood that the V/I sensor 207 is disposed within the RF signal generator 201.

In some embodiments, the RF signal generator control system 209 is programmed to implement a closed-loop feedback control system with two modes of control for optimizing RF power transmission from the RF signal generator 201 to the plasma 123 within the plasma processing system 100A/100B. A first mode of control is based on minimization of the reflection coefficient (or Gamma ($\Gamma$)), where $\Gamma=V_r/V_f$, with $V_r$ being the complex amplitude of the reflected RF signal, and with $V_f$ being the complex amplitude of the forward RF signal. The first mode of control seeks to minimize the reflection coefficient to as close to zero as possible. In some embodiments, the first mode of control is implemented in terms of voltage standing wave ratio (VSWR) rather than reflection coefficient, where $VSWR=|V_{max}|/|V_{min}|=(1+|\Gamma|)/(1-|\Gamma|)$, with $|V_{max}|=|V_f|+|V_r|$ and $|V_{min}|=|V_f|-|V_r|$. In these embodiments, the first mode of control seeks to minimize the value of VSWR to as close to one as possible, where one is the minimum possible value of VSWR. The first mode of control is implemented by adjusting a gamma control capacitor 224 in the impedance matching system 215. A second mode of control of the closed-loop feedback system implemented by the GBMC system 200 is to adjust the operating frequency of the RF signal generator 201 based on comparison of an actual operating frequency of the RF signal generator 201 to a target operating frequency of the RF signal generator 201. More specifically, the second mode of control seeks to minimize a difference between the actual operating frequency of the RF signal generator 201 as determined by the RF signal generator control system 209 and a target operating frequency of the RF signal generator 201 as input to the RF signal generator control system 209. The second mode of control is implemented by adjusting a frequency control capacitor 230 in the impedance matching system 215. The gamma control capacitor 224 is a first control capacitor, and the frequency control capacitor 230 is a second control capacitor.

In some embodiments, the RF signal generator control system 209 is programmed to use the real-time measured voltage on the output 210 of the RF signal generator 201 to calculate the real-time reflection coefficient and/or VSWR at the output 210 of the RF signal generator 201. In this manner, the real-time reflection coefficient and/or VSWR at the output 210 of the RF signal generator 201, as determined using voltage measurements taken within the RF signal generator 201, can be used as a feedback signal to minimize the reflection coefficient to as close to zero as possible and/or to minimize the VSWR to as close to one as possible.

The impedance matching system 215 includes a capacitor 219, an inductor 221, a variable capacitor 224, an inductor 229, and a variable capacitor 230. The capacitor 219 has an input terminal connected to the input 217 of the impedance matching system 215. An output terminal of the capacitor 219 is connected to an input terminal of the inductor 221. An output terminal of the inductor 221 is connected to the output 223 of the impedance matching system 215. In this manner, the capacitor 219 and the inductor 221 are connected in series between the input 217 and the output 223 of the impedance matching system 215.

The variable capacitor 224 has an input terminal connected to the input 217 of the impedance matching system 215. The variable capacitor 224 has an output terminal connected to a reference potential 227, e.g., reference ground potential. The variable capacitor 224 is referred to herein as a gamma control capacitor 224, and is used to effect minimization of the real-time reflection coefficient and/or real-time VSWR as determined by the RF signal generator control system 209.

The inductor 229 has an input terminal connected to the output 223 of the impedance matching system 215. The inductor 229 has an output terminal connected to an input terminal of the variable capacitor 230. The variable capacitor 230 has an output terminal connected to the reference potential 227. The variable capacitor 230 is referred to herein as a frequency control capacitor 227, and is used to effect minimization of a difference between the actual operating frequency of the RF signal generator 201 as determined by the RF signal generator control system 209 and a target operating frequency of the RF signal generator 201 as input to the RF signal generator control system 209.

The impedance matching system 215 also includes a gamma capacitor control system 225 configured to control a capacitance setting of the gamma control capacitor 224. In some example embodiments, the gamma capacitor control system 225 includes a mechanical network, such as a stepper motor and corresponding gearing and linkage, connected to move electrically conductive components, such as plates, of the gamma control capacitor 224 relative to each other in a controlled manner to set the capacitance of the gamma control capacitor 224 to a specified capacitance and/or to effect a change in capacitance of the gamma control capacitor 224. It should be understood that in various embodiments, the gamma capacitor control system 225 can be configured in different ways, so long as the gamma capacitor control system 225 provides for setting and adjustment of the capacitance of the gamma control capacitor 224.

The gamma capacitor control system 225 includes circuitry for receiving and effecting execution of input signals that direct setting and/or adjustment of the gamma control capacitor 224. The gamma capacitor control system 225 also includes circuitry for generating output signals that indicate a current capacitance setting of the gamma control capacitor 224. In some embodiments, the circuitry of the gamma capacitor control system 225 is implemented on a printed circuit board. In some embodiments, the circuitry of the gamma capacitor control system 225 includes a data processing capability, e.g., includes a computer processor and associated computer memory. However, in some embodiments, the circuitry of the gamma capacitor control system 225 is less complex and does not include a data processing capability, but nevertheless is configured to receive and effect execution of input signals that direct setting and/or adjustment of the gamma control capacitor 224, and generate output signals that indicate the current capacitance setting of the gamma control capacitor 224.

The impedance matching system 215 also includes a frequency capacitor control system 231 configured to control a capacitance setting of the frequency control capacitor 230. In some example embodiments, the frequency capacitor control system 231 includes a mechanical network, such as a stepper motor and corresponding gearing and linkage, connected to move electrically conductive components, such as plates, of the frequency control capacitor 230 relative to each other in a controlled manner to set the capacitance of the frequency control capacitor 230 to a specified capacitance and/or to effect a change in capacitance of the frequency control capacitor 230. It should be understood that in various embodiments, the frequency capacitor control system 231 can be configured in different ways, so long as the frequency capacitor control system 231 provides for setting and adjustment of the capacitance of the frequency control capacitor 230.

The frequency capacitor control system 231 includes circuitry for receiving and effecting execution of input signals that direct setting and/or adjustment of the frequency control capacitor 230. The frequency capacitor control system 231 also includes circuitry for generating output signals that indicate a current capacitance setting of the frequency control capacitor 230. In some embodiments, the circuitry of the frequency capacitor control system 231 is implemented on a printed circuit board. In some embodiments, the circuitry of the frequency capacitor control system 231 includes a data processing capability, e.g., includes a computer processor and associated computer memory. However, in some embodiments, the circuitry of the frequency capacitor control system 231 is less complex and does not include a data processing capability, but nevertheless is configured to receive and effect execution of input signals that direct setting and/or adjustment of the frequency control capacitor 230, and generate output signals that indicate the current capacitance setting of the frequency control capacitor 230.

The impedance matching system 215 includes a network interface controller 239 that enables the impedance matching system 215 to receive data/signals from and send data/signals to systems outside of the impedance matching system 215. Examples of the network interface controller 239 include a network interface card, a network adapter, etc. In various embodiments, the network interface controller 239 is configured to operate in accordance with one or more communication protocols and associated physical layers, such as Ethernet and/or EtherCAT, among others. The network interface controller 239 is connected to the gamma capacitor control system 225, as indicated by connection 235, to provide for transmission of incoming input signals to the gamma capacitor control system 225, and to provide for transmission of outgoing output signals from the gamma capacitor control system 225. Similarly, the network interface controller 239 is connected to the frequency capacitor control system 231, as indicated by connection 237, to provide for transmission of incoming input signals to the frequency capacitor control system 231, and to provide for transmission of outgoing output signals from the frequency capacitor control system 231.

The GBMC system 200 also includes a data/signal connection between the RF signal generator 201 and the impedance matching system 215. More specifically, the network interface controller 211 of the RF signal generator 201 is connected to the network interface controller 179 of the control module 163, as indicated by connection 243. In some embodiments, the network interface controller 211 connects to the network interface controller 179 through one or more network devices 249, such as network switches and/or network hubs, e.g., Ethernet switch and/or EtherCAT hub, among others. Also, the network interface controller 239 of the impedance matching system 215 is connected to the network interface controller 179 of the control module 163, as indicated by connection 245. In some embodiments, the network interface controller 239 connects to the network interface controller 179 through one or more network devices 251, such as network switches and/or network hubs, e.g., Ethernet switch and/or EtherCAT hub, among others.

Figure 3:
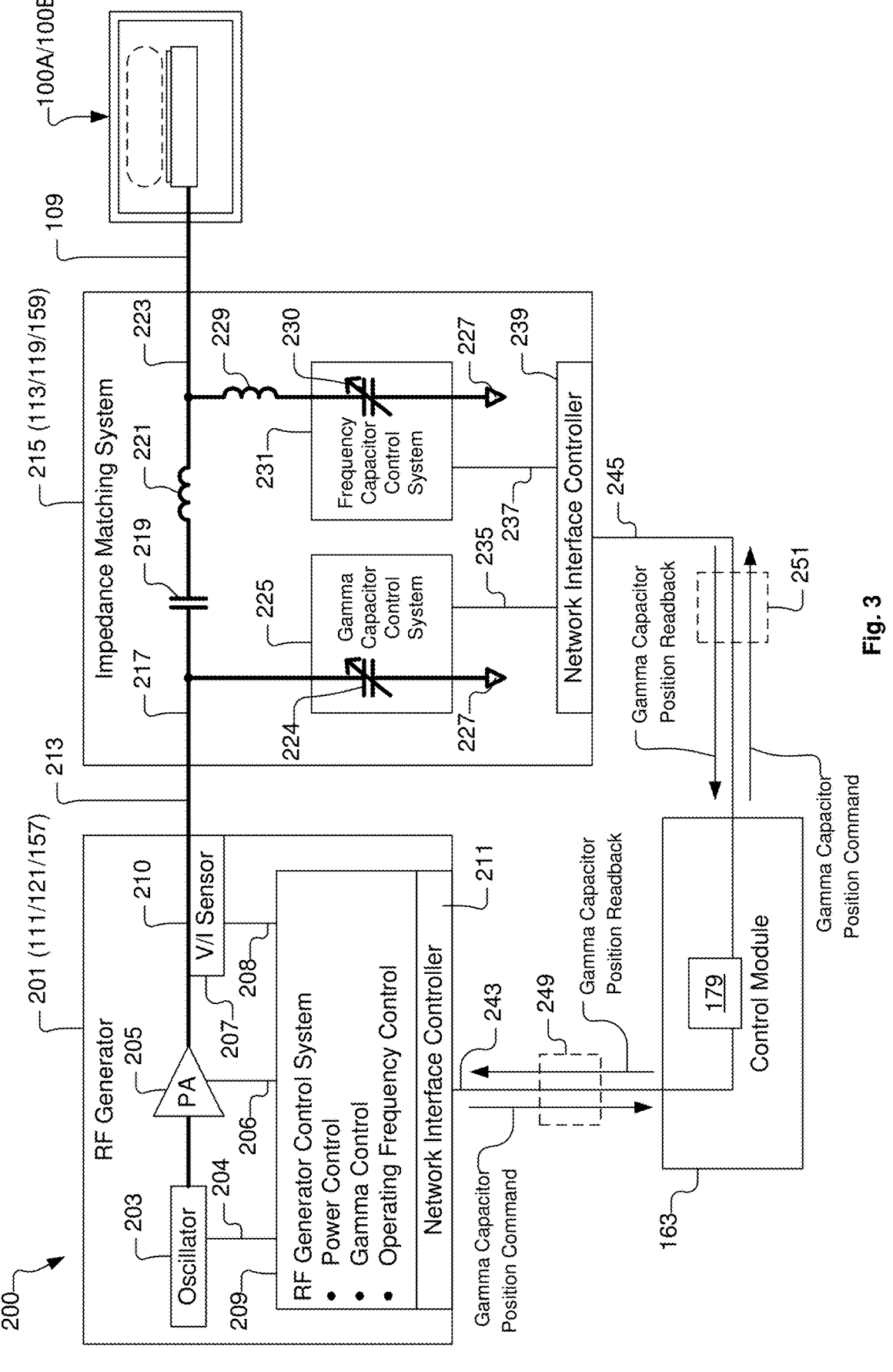
FIG. 3 shows an operational diagram of the GBMC system with regard to adjusting the gamma control capacitor to minimize the reflection coefficient (or VSWR), in accordance with some embodiments.

The GBMC system 200 improves efficiency of RF power transmission to the plasma 123 by using closed-loop feedback to: 1) adjust the gamma control capacitor 224 to minimize the reflection coefficient (and/or VSWR), and 2) adjust the frequency control capacitor 230 to minimize the difference between the target operating frequency and the actual operating frequency of the RF signal generator 201. FIG. 3 shows an operational diagram of the GBMC system 200 with regard to adjusting the gamma control capacitor 224 to minimize the reflection coefficient (and/or VSWR), in accordance with some embodiments. The RF signal generator control system 209 is operable to send data conveying a gamma control capacitor position command to the gamma capacitor control system 225 within the impedance matching system 215, by way of the control module 163. Also, the gamma capacitor control system 225 is operable to send data conveying a gamma control capacitor position readback to the RF signal generator control system 209, by way of the control module 163.

Figure 4:
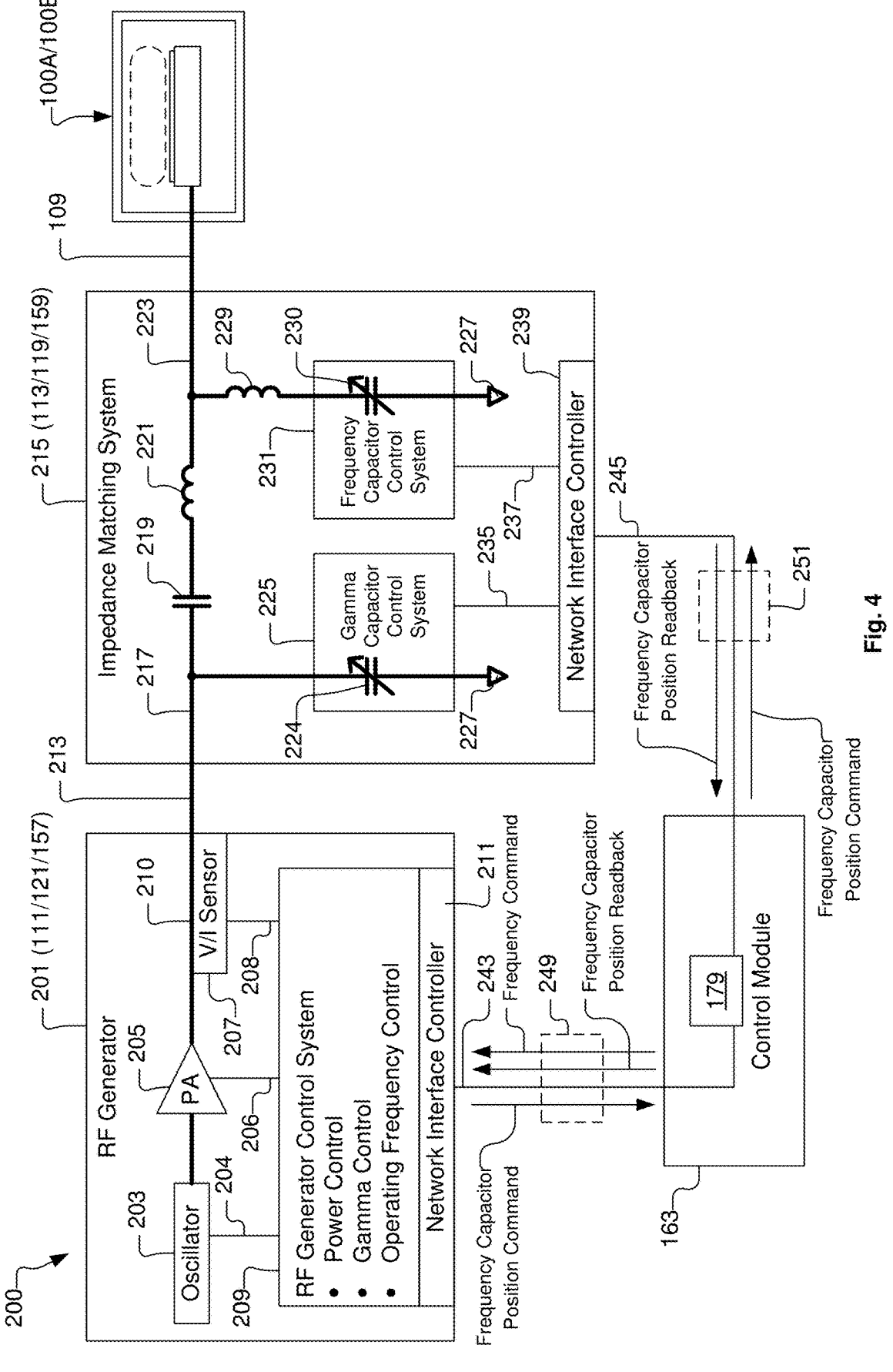
FIG. 4 shows an operational diagram of the GBMC system with regard to adjusting the frequency control capacitor to minimize the difference between the target operating frequency and the actual operating frequency of the RF signal generator, in accordance with some embodiments.

FIG. 4 shows an operational diagram of the GBMC system 200 with regard to adjusting the frequency control capacitor 230 to minimize the difference between the target operating frequency and the actual operating frequency of the RF signal generator 201, in accordance with some embodiments. The RF signal generator control system 209 is operable to receive a frequency command from the control module 163, where the frequency command specifies a target frequency for signals to be generated by the RF signal generator 201. The RF signal generator control system 209 is operable to send data conveying a frequency control capacitor position command to the frequency capacitor control system 231 within the impedance matching system 215, by way of the control module 163. Also, the frequency capacitor control system 231 is operable to send data conveying a frequency control capacitor position readback to the RF signal generator control system 209, by way of the control module 163.

It should be understood that from the viewpoint of the RF signal generator control system 209, the RF signal generator control system 209 is in data communication with the control module 163. Also, it should be understood that from the viewpoint of the impedance matching system 215, the impedance matching system 215 is in data communication with the control module 163. The control module 163 is programmed to moderate data communication between the RF signal generator control system 209 and the impedance matching system 215. In this manner, the RF signal generator control system 209 is configured and programmed to communicate directly with the control module 163, but does not need to be configured and programmed to communicate directly with the impedance matching system 215. Similarly, the impedance matching system 215 is configured and programmed to communicate directly with the control module 163, but does not need to be configured and programmed to communicate directly with the RF signal generator control system 201. The control module 163 is effectively configured and programmed to provide a data communication conduit between the RF signal generator control system 209 and the impedance matching system 215, which avoids needing a direct data communication link between the RF signal generator control system 209 and the impedance matching system 215.

During operation of the plasma processing system 100A/100B, the RF signal generator 201 operates to generate and transmit RF signals through the impedance matching system 215 to the plasma processing system 100A/100B to generate the plasma 123. As the RF signal generator 201 operates, the V/I sensor 207 operates to measure the time-varying voltage present at the output 210 of the RF signal generator 201 and transmit signals indicating the measured time-varying voltage to the RF signal generator control system 209 through the connection 208. The RF signal generator control system 209 operates to analyze the time-varying voltage at the output 210 of the RF signal generator 201, as provided by the V/I sensor 207 within the RF signal generator 201, to determine the real-time reflection coefficient and/or VSWR. At the same time, the RF signal generator control system 209 is aware of the current setting of the gamma control capacitor 224 within the impedance matching system 215, by way of the gamma control capacitor position readback signal received at the RF signal generator control system 209 from the gamma capacitor control system 225 within the impedance matching system 215, by way of the control module 163.

Figure 5A:
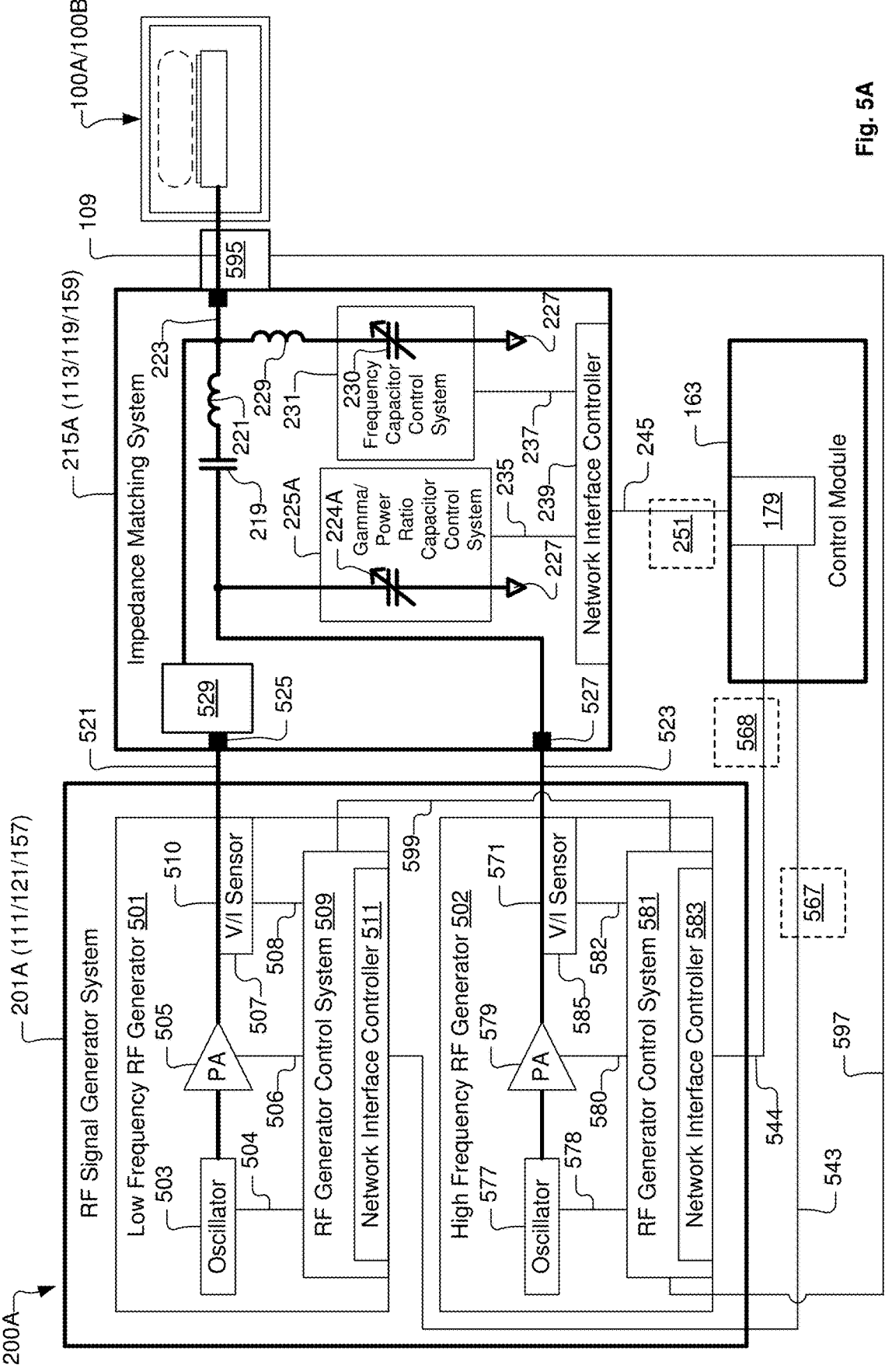
FIG. 5A shows a GBMC system in which an RF signal supply system includes a low frequency RF signal generator and a high frequency RF signal generator, in accordance with some embodiments.

FIG. 5A shows a GBMC system 200A in which an RF signal supply system 201A includes a low frequency RF signal generator 501 and a high frequency RF signal generator 502, in accordance with some embodiments. Each of the low frequency RF signal generator 501 and the high frequency RF signal generator 502 is connected to supply RF signals through an impedance matching system 215A to plasma processing system 100A/100B. In various embodiments, the RF signal supply system 201A is connected through the impedance matching system 215A to an electrode or antenna (coil) within the plasma processing system 100A/100B.

The low frequency RF signal generator 501 is configured to generate and transmit low frequency RF signals of controlled amplitude and frequency from an output 510 of the low frequency RF signal generator 501, through/along an electrical conductor 521, to an input 525 of the impedance matching system 215A. The low frequency RF signals travel through the impedance matching circuitry 529 to an output 223 of the impedance matching system 215A. From the output 223, the low frequency RF signals travel through/along the RF feed structure 109, to an electrode or antenna within the plasma processing system 100A/100B.

Similarly, the high frequency RF signal generator 502 is configured to generate and transmit high frequency RF signals of controlled amplitude and frequency from an output 571 of the high frequency RF signal generator 502, through/along an electrical conductor 523, to an input 527 of the impedance matching system 215A. The high frequency RF signals travel through the impedance matching system 215A to the output 223 of the impedance matching system 215A. From the output 223, the high frequency RF signals travel through/along the RF feed structure 109, to an electrode or antenna within the plasma processing system 100A/100B.

Figure 5B:
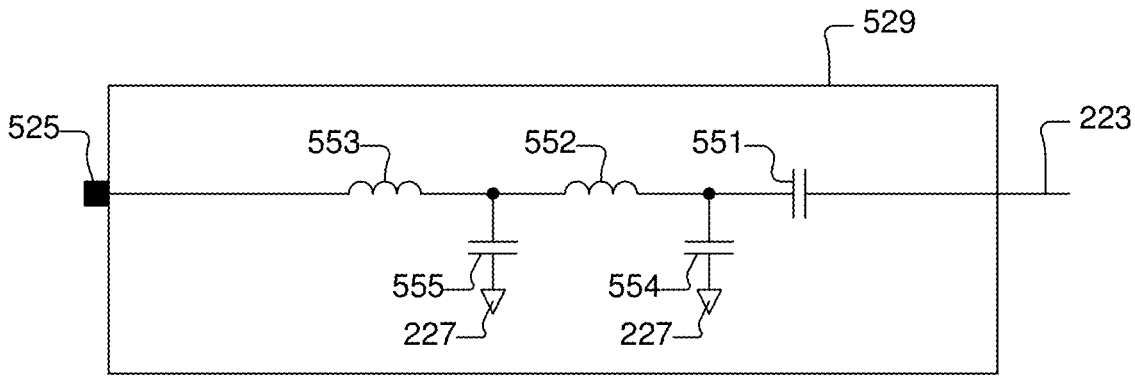
FIG. 5B shows an example of the impedance matching circuitry configured and connected to match an impedance at the output of the low frequency RF signal generator to a design impedance, in accordance with some embodiments.

FIG. 5B shows an example of the impedance matching circuitry 529 configured and connected to match an impedance at the output 510 of the low frequency RF signal generator 501 to a design impedance, in accordance with some embodiments. The example impedance matching circuitry 529 includes an inductor 553, and inductor 552, and a capacitor 551 electrically connected in series between the input 525 and the output 223 of the impedance matching system 215A. Also, the example impedance matching circuitry 529 includes a capacitor 554 having a first terminal connected between the capacitor 551 and the inductor 552. The capacitor 554 has a second terminal connected to the reference potential 227. Also, the example impedance matching circuitry 529 includes a capacitor 555 having a first terminal connected between the inductor 552 and the inductor 553. The capacitor 555 has a second terminal connected to the reference potential 227. It should be understood that the impedance matching circuitry 529 is provided by way of example. In other embodiments, the impedance matching circuitry 529 can include a different arrangement of capacitors and/or inductors, and can include either more or less capacitors and/or inductors that what is shown in the example impedance matching circuitry 529 of FIG. 5B.

The low frequency RF signal generator 501 includes an oscillator 503 for generating RF signals. The oscillator 503 is an electronic circuit that produces a periodic oscillating electrical signal, such a sine wave electrical signal, having a specified frequency within the RF range. In some embodiments, the oscillator 503 is a low-frequency oscillator capable of oscillating within a frequency range extending from about 50 kHz to about 3 MHz. In some embodiments, the oscillator 503 is set to generate low frequency RF signals within a frequency range extending from about 330 kHz to about 440 kHz. An output of the oscillator 503 is connected to an input of a power amplifier 505. The power amplifier 505 operates to amplify the low frequency RF signals generated by the oscillator 503, and transmit the amplified low frequency RF signals through an output of the power amplifier 505 to the output 510 of the low frequency RF signal generator 501.

The low frequency RF signal generator 501 also includes a control system 509 configured to provide for control of all operational aspects of the low frequency RF signal generator 501. In some embodiments, the control system 509 includes a processor, a data storage device, an input/output interface, and a data bus through which the processor, the data storage device, and the input/output interface communicate data to and from each other. The control system 509 is connected to provide for control of the oscillator 503, as indicated by connection 504. The control system 509 is also connected to provide for control of the power amplifier 505, as indicated by connection 506. The control system 509 also includes a NIC 511 that enables the control system 509 to send data to and receive data from systems outside of the low frequency RF signal generator 501. Examples of the NIC 511 include a network interface card, a network adapter, etc. In various embodiments, the NIC 511 is configured to operate in accordance with one or more network communication protocols and associate physical layers, such as Ethernet and/or EtherCAT, among others.

It should be understood that the control system 509 is connected and configured to control essentially any aspect of the low frequency RF signal generator 501. And, it should be understood that the control system 509 can be connected and configured to monitor essentially any physical and/or electrical state, condition, and/or parameter at essentially any location within the low frequency RF signal generator 501. The control system 509 is also configured to direct operation of the low frequency RF signal generator 501 in accordance with one or more prescribed algorithm(s). For example, the control system 509 is configured to operate the low frequency RF signal generator 501 by executing input and control instructions/programs. The input and control instructions/programs include a target RF power setpoint and a target frequency setpoint, among other parameters associated with operation and control of the low frequency RF signal generator 501.

The low frequency RF signal generator 501 also includes a voltage/current (V/I) sensor 507 connected to the output 510 of the low frequency RF signal generator 501. The V/I sensor 507 is connected to the control system 509, as shown by connection 508. In this configuration, the V/I sensor 507 provides a real-time measurement of voltage and current present on the output 510 of the low frequency RF signal generator 501 to the control system 509. In some embodiments, the V/I sensor 507 is disposed within the low frequency RF signal generator 501.

The high frequency RF signal generator 502 includes an oscillator 577 for generating RF signals. The oscillator 577 is an electronic circuit that produces a periodic oscillating electrical signal, such a sine wave electrical signal, having a specified frequency within the RF range. In some embodiments, the oscillator 577 is a high-frequency oscillator capable of oscillating within a frequency range extending from about 10 MHz to about 130 MHz. In some embodiments, the oscillator 577 is set to generate high frequency RF signals within a range extending from about 57 MHz to about 63 MHz. An output of the oscillator 577 is connected to an input of a power amplifier 579. The power amplifier 579 operates to amplify the high frequency RF signals generated by the oscillator 577, and transmit the amplified high frequency RF signals through an output of the power amplifier 579 to the output 571 of the high frequency RF signal generator 502.

The high frequency RF signal generator 502 also includes a control system 581 configured to provide for control of all operational aspects of the high frequency RF signal generator 502. In some embodiments, the control system 581 includes a processor, a data storage device, an input/output interface, and a data bus through which the processor, the data storage device, and the input/output interface communicate data to and from each other. The control system 581 is connected to provide for control of the oscillator 577, as indicated by connection 578. The control system 581 is also connected to provide for control of the power amplifier 579, as indicated by connection 580. The control system 581 also includes a NIC 583 that enables the control system 581 to send data to and receive data from systems outside of the high frequency RF signal generator 502. Examples of the NIC 583 include a network interface card, a network adapter, etc. In various embodiments, the NIC 583 is configured to operate in accordance with one or more network communication protocols and associate physical layers, such as Ethernet and/or EtherCAT, among others.

It should be understood that the control system 581 is connected and configured to control essentially any aspect of the high frequency RF signal generator 502. And, it should be understood that the control system 581 can be connected and configured to monitor essentially any physical and/or electrical state, condition, and/or parameter at essentially any location within the high frequency RF signal generator 502. The control system 581 is also configured to direct operation of the high frequency RF signal generator 502 in accordance with a prescribed algorithm. For example, the control system 581 is configured to operate the high frequency RF signal generator 502 by executing input and control instructions/programs. The input and control instructions/programs include a target RF power setpoint and a target frequency setpoint, among other parameters associated with operation and control of the high frequency RF signal generator 502. The control system 581 of the high frequency RF signal generator 502 is also connected in bi-directional data/signal communication with the control system 509 of the low frequency RF signal generator 501, as indicated by connection 599.

The high frequency RF signal generator 502 also includes a voltage/current (V/I) sensor 585 connected to the output 571 of the high frequency RF signal generator 502. The V/I sensor 585 is connected to the control system 581, as shown by connection 582. In this configuration, the V/I sensor 585 provides a real-time measurement of voltage and current present on the output 571 of the high frequency RF signal generator 502 to the control system 581. In some embodiments, the V/I sensor 585 is disposed within the high frequency RF signal generator 502.

In some embodiments, the control system 509 of the low frequency RF signal generator 501 is programmed to determine the real-time reflection coefficient (or Gamma (Γ)) at the output 510 of the low frequency RF signal generator 501. Also, in some embodiments, the control system 509 of the low frequency RF signal generator 501 is also programmed to determine the voltage standing wave ratio (VSWR) at the output 510 of the low frequency RF signal generator 501. Minimization of the reflected RF power associated with the low frequency RF signal generated by the low frequency RF signal generator 501 occurs when the reflection coefficient at the output 510 of the low frequency RF signal generator 501 is as close to zero as possible. Also, minimization of the reflected RF power associated with the low frequency RF signal generated by the low frequency RF signal generator 501 occurs when the VSWR at the output 510 of the low frequency RF signal generator 501 is as close to one as possible, where one is the minimum possible value of VSWR. In some embodiments, the control system 509 is programmed to use the real-time measured voltage on the output 510 of the low frequency RF signal generator 501 to calculate the real-time reflection coefficient and/or VSWR at the output 510 of the low frequency RF signal generator 501. The real-time reflection coefficient and/or VSWR at the output 510 of the low frequency RF signal generator 501, as determined using voltage measurements taken within the low frequency RF signal generator 501, can be used as a feedback signal to minimize the reflection coefficient to as close to zero as possible and/or to minimize the VSWR to as close to one as possible.

Similarly, in some embodiments, the control system 581 of the high frequency RF signal generator 502 is programmed to determine the reflection coefficient (or Gamma (Γ)) and VSWR at the output 571 of the high frequency RF signal generator 502. Minimization of the reflected RF power associated with the high frequency RF signal generated by the high frequency RF signal generator 502 occurs when the reflection coefficient at the output 571 of the high frequency RF signal generator 502 is as close to zero as possible. Also, minimization of the reflected RF power associated with the high frequency RF signal generated by the high frequency RF signal generator 502 occurs when the VSWR at the output 571 of the high frequency RF signal generator 502 is as close to one as possible, where one is the minimum possible value of VSWR. In some embodiments, the control system 581 is programmed to use the real-time measured voltage on the output 571 of the high frequency RF signal generator 502 to calculate the real-time reflection coefficient and/or VSWR at the output 571 of the high frequency RF signal generator 502. The real-time reflection coefficient and/or VSWR at the output 571 of the high frequency RF signal generator 502, as determined using voltage measurements taken within the high frequency RF signal generator 502, can be used as a feedback signal to minimize the reflection coefficient to as close to zero as possible and/or to minimize the VSWR to as close to one as possible at the output 571 of the high frequency RF signal generator 502. Also, the real-time reflection coefficient and/or VSWR at the output 571 of the high frequency RF signal generator 502, as determined using voltage measurements taken within the high frequency RF signal generator 502, can be used to determine a reflected RF power at the output of the 571 of the high frequency RF signal generator 502.

The control module 163 of the plasma processing system 100A/100B is connected to the control system 509 of the low frequency RF signal generator 501, by way of the NIC 179 and the NIC 511, as indicated by connection 543. In some embodiments, the NIC 179 is connected to the NIC 511 through one or more network devices 567, such as network switches and/or network hubs, e.g., Ethernet switch and/or EtherCAT hub, among others. The control module 163 is connected to the control system 581 of the high frequency RF signal generator 502, by way of the NIC 179 and the NIC 583, as indicated by connection 544. In some embodiments, the NIC 179 is connected to the NIC 583 through one or more network devices 568, such as network switches and/or network hubs, e.g., Ethernet switch and/or EtherCAT hub, among others. The control module 163 is connected to the impedance matching system 215A, by way of the NIC 179 and the NIC 239, as indicated by connection 245. In some embodiments, the NIC 179 is connected to the NIC 239 through one or more network devices 251, such as network switches and/or network hubs, e.g., Ethernet switch and/or EtherCAT hub, among others. The NIC 179 enables the control module 163 to send data to and receive data from systems outside of the control module 163. Examples of the NIC 179 includes a network interface card, a network adapter, etc. In various embodiments, the NIC 179 is configured to operate in accordance with one or more network communication protocols and associate physical layers, such as Ethernet and/or EtherCAT, among others.

In some embodiments, the control module 163 is programmed to direct operation of the low frequency RF signal generator 501 and the high frequency RF signal generator 502 in accordance with a frequency tuning process. The frequency tuning process automatically adjusts an operating frequency of the low frequency RF signal generator 501 about a target frequency of the low frequency signal to minimize reflected power at the output 510 of the low frequency RF signal generator 501. Also, in the frequency tuning process, an operating frequency of the high frequency RF signal generator 502 is automatically adjusted about a target frequency of the high frequency signal to minimize reflected power at the output 571 of the high frequency RF signal generator 502. In the frequency tuning process, the operating frequency of the high frequency RF signal generator 502 is separately adjusted about the target frequency of the high frequency signal in each of a plurality of temporal bins that collectively span a complete cycle of the low frequency signal generated by the low frequency RF signal generator 501, with the plurality of temporal bins and corresponding separate operating frequency adjustments (of the high frequency RF signal generator 502) repeating in sequence over each cycle of the low frequency signal generated by the low frequency RF signal generator 501.

Figure 5C:
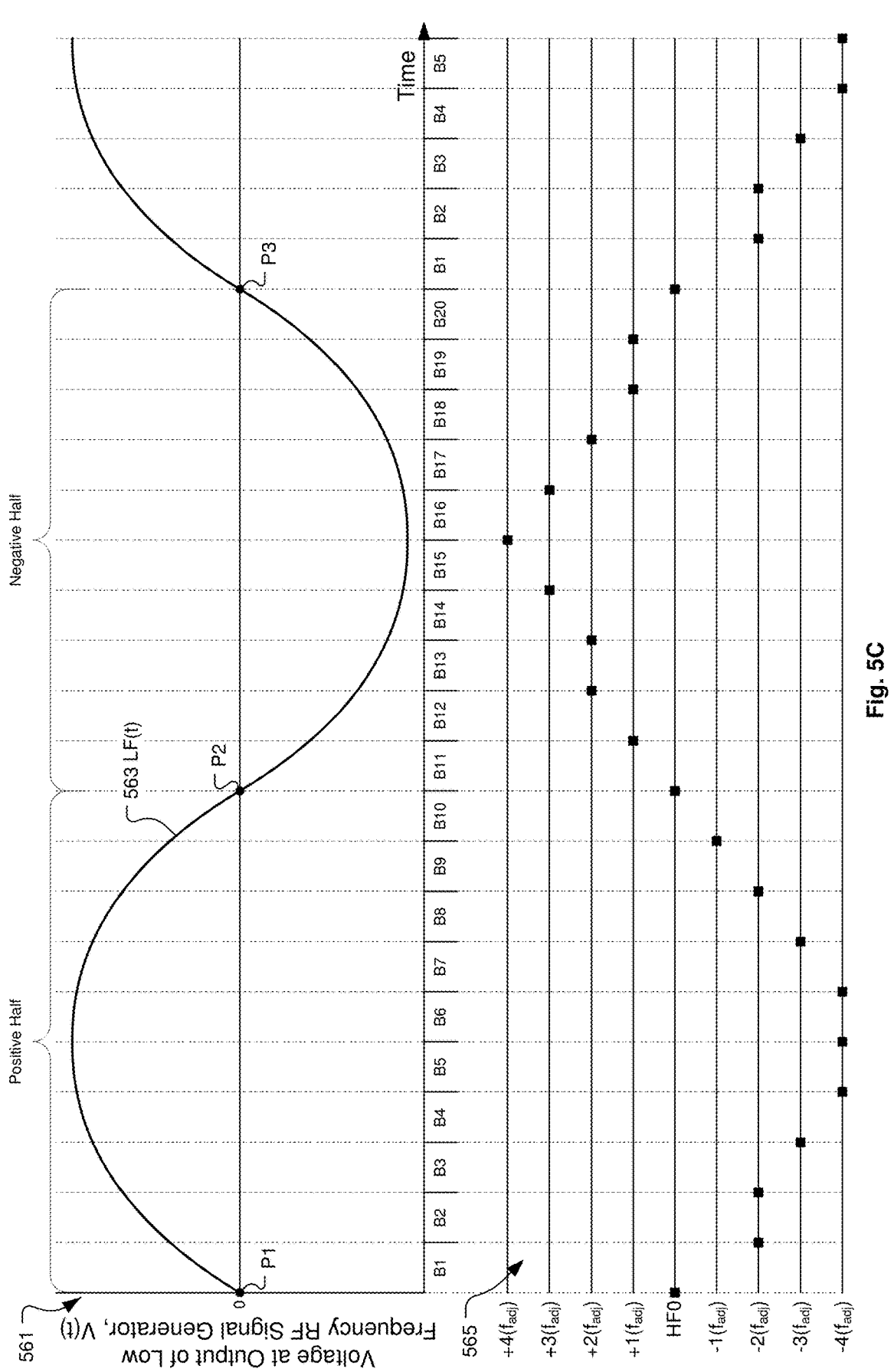
FIG. 5C shows a diagram of a frequency tuning process implemented using the GBMC system of FIG. 5A, in accordance with some embodiments.

FIG. 5C shows a diagram of the frequency tuning process, in accordance with some embodiments. An upper plot 561 shows a curve 563 of voltage measured as a function of time at the output 510 of the low frequency RF signal generator 501. The curve 563 represents the low frequency signal generated by the low frequency RF signal generator 501.

The low frequency signal is a sinusoidal signal characterized by a repeating cycle. In the upper plot 561, a given cycle of the low frequency signal begins at a point P1 and ends at a point P3, with a point P2 marking the half-cycle location. In the example of FIG. 5C, the cycle of the low frequency signal begins at the point P1 where the low frequency signal crosses the zero voltage level in the positive direction. This beginning location of the cycle of the low frequency signal is referred to herein as the positive direction zero voltage crossing of the low frequency signal. The half-cycle location occurs at the point P2 where the low frequency signal crosses the zero voltage level in the negative direction. And, the cycle of the low frequency signal ends at the point P3 where the low frequency signal again crosses the zero voltage level in the positive direction. The cycle of the low frequency signal is divided into a plurality of temporal bins B1 through B(N), where N is the total number of temporal bins. The example of FIG. 5C shows the cycle of the low frequency signal is divided into 20 (N=20) temporal bins B1 through B20. The first temporal bin B1 of the plurality of temporal bins B1 through B(N) begins at a positive direction zero voltage crossing of the complete cycle of the low frequency signal. The last temporal bin B(N) of the plurality of temporal bins B1 through B(N) ends at the next positive direction zero voltage crossing of the complete cycle of the low frequency signal.

It should be understood that the 20 temporal bins (N=20) of FIG. 5C is shown by way of example. In other embodiments, the plurality of temporal bins B1 through B(N) can have N set at either less than 20 or greater than 20. Also, the example of FIG. 5C shows that each of the plurality of temporal bins B1 through B(N) covers an equal amount of time. However, in other embodiments, different ones of the plurality of temporal bins B1 through B(N) can be defined to cover different amounts of time. For example, if a higher resolution of adjustment in the frequency of the high frequency signal, as generated by the high frequency RF signal generator 502, is desired along a particular portion of the cycle of the low frequency signal, as generated by the low frequency RF signal generator 501, some of the plurality of temporal bins B1 through B(N) along the particular portion of the cycle of the low frequency signal are respectively defined to cover a smaller amount of time.

FIG. 5C also includes a lower plot 565 that shows adjustments of the operating frequency of the high frequency RF signal generator 502 at each of the plurality of temporal bins B1 through B20 that collectively span the complete cycle of the low frequency signal generated by the low frequency RF signal generator 501. The operating frequency of the high frequency RF signal generator 502 is set at an adjusted frequency during each of the plurality of temporal bins B1 through B20. The adjusted operating frequency of the high frequency RF signal generator 502 in any given one of the plurality of temporal bins B1 through B(N) is independently and separately set relative to others of the plurality of temporal bins B1 through B(N). In some embodiments, the adjusted frequency of a given one of the plurality of temporal bins B1 through B(N) is an integer multiple of a frequency adjustment amount ($f_{adj}$) about a target frequency (HF0) of the high frequency signal generated by the high frequency RF signal generator 502. For example, FIG. 5C shows a line corresponding to the target frequency (HF0) of the high frequency signal generated by the high frequency RF signal generator 502. FIG. 5C also shows lines for each of the integer multiples of the frequency adjustment amount ($f_{adj}$), respectively. As shown in FIG. 5C, the adjusted frequency of a given one of the plurality of temporal bins B1 through B20 is an integer multiple of the frequency adjustment amount ($f_{adj}$) about the target frequency (HF0). In some embodiments, the integer multiple is either −4, −3, −2, −1, 0, +1, +2, +3, +4. However, in other embodiments, integer multiples less than −4 and/or greater than +4 can be used. Also, in some embodiments, the integer multiple is replaced by a fractional multiple. Also, in some embodiments, the frequency adjustment amount ($f_{adj}$) is set as the target frequency of the low frequency signal as generated by the low frequency RF signal generator 501. In the example of FIG. 5C, if the target frequency of the low frequency signal as generated by the low frequency RF signal generator 501 is 400 kHz, then the bin-level operating frequency of the high frequency RF signal generator 502 at −4($f_{adj}$) is HF0-1600 kHz, and at −3($f_{adj}$) is HF0-1200 kHz, an at −2($f_{adj}$) is HF0-800 kHz, and at −1($f_{adj}$) is HF0-400 kHz, and at 0($f_{adj}$) is HF0, and at +1($f_{adj}$) is HF0+400 kHz, and at +2($f_{adj}$) is HF0+800 kHz, and at +3($f_{adj}$) is HF0+1200 kHz, and at +4($f_{adj}$) is HF0+1600 kHz. The operating frequency of the high frequency RF signal generator 502 for a given one the plurality of temporal bins B1 through B(N), e.g., the setting of integer multiple of the frequency adjustment amount ($f_{adj}$) for the given one of the plurality of temporal bins B1 through B(N), is determined empirically as the frequency adjustment that minimizes the reflected RF power at the output 571 of the high frequency RF signal generator 502 during the given one of the plurality of temporal bins B1 through B(N). Also, in some embodiments, the frequency adjustment amount ($f_{adj}$) is set at a determined amount of frequency that is different than the target frequency of the low frequency signal as generated by the low frequency RF signal generator 501.

The adjusted frequencies of the high frequency RF signal generator 502 across the plurality of temporal bins B1 through B(N) are repeated for each cycle of the low frequency signal generated by the low frequency RF signal generator 501. Periodically, the frequency tuning process will re-tune (re-determine) the adjusted frequencies of the high frequency RF signal generator 502 for the plurality of temporal bins B1 through B(N) to ensure that the reflected RF power at the output 571 of the high frequency RF signal generator 502 is minimized to the extent possible. In some embodiments, the frequency tuning process is implemented by programming the control module 163, which in turn directs operation of the control system 509 within the low frequency RF signal generator 501 and operation of the control system 581 within the high frequency RF signal generator 502.

In the frequency tuning process as described with regard to FIG. 5C, a negative-to-positive reflected power (NTPRP) ratio is determined by dividing an average reflected RF power during a negative half of the cycle of the low frequency signal (between the point P2 and the point P3 in FIG. 5C) by an average reflected RF power during a positive half of the cycle of the low frequency signal (between the point P1 and the point P2 in FIG. 5C). Also, in the frequency tuning process as described with regard to FIG. 5C, a negative-to-positive delivered power (NTPDP) ratio is determined by dividing an average delivered RF power during the negative half of the cycle of the low frequency signal (between the point P2 and the point P3 in FIG. 5C) by an average delivered RF power during the positive half of the cycle of the low frequency signal (between the point P1 and the point P2 in FIG. 5C). In some embodiments, a gamma/power ratio control capacitor 224A is adjusted in real-time to achieve and maintain a target value of the NTPRP ratio. In some embodiments, the gamma/power ratio control capacitor 224A is adjusted in real-time to achieve and maintain a target value of the NTPDP ratio. The gamma/power ratio control capacitor 224A is a first control capacitor, and the frequency control capacitor 230 is a second control capacitor. Also, the gamma/power ratio control capacitor 224A is included within the gamma/power ratio capacitor control system 225A within the impedance matching system 215A as shown in FIG. 5A, whereas the gamma control capacitor 224 is included within the gamma capacitor control system 225 within the impedance matching system 215 as shown in FIG. 4.

In some embodiments, the RF signal generator control system 509 of the low frequency RF signal generator 501 is operable to send data conveying a gamma/power ratio control capacitor 224A position command to a gamma/power ratio capacitor control system 225A within the impedance matching system 215A, by way of the control module 163. Also, the gamma/power ratio capacitor control system 225A is operable to send data conveying a gamma/power ratio control capacitor 224A position readback to the RF signal generator control system 509, by way of the control module 163. It should be understood that from the viewpoint of the RF signal generator control system 509, the RF signal generator control system 509 is in data communication with the control module 163. Also, it should be understood that from the viewpoint of the impedance matching system 215A, the impedance matching system 215A is in data communication with the control module 163. The control module 163 is programmed to moderate data communication between the RF signal generator control system 509 and the impedance matching system 215A. In this manner, the RF signal generator control system 509 is configured and programmed to communicate directly with the control module 163, but does not need to be configured and programmed to communicate directly with the impedance matching system 215A. Similarly, the impedance matching system 215A is configured and programmed to communicate directly with the control module 163, but does not need to be configured and programmed to communicate directly with the RF signal generator control system 509. The control module 163 is effectively configured and programmed to provide a data communication conduit between the RF signal generator control system 509 and the impedance matching system 215A, which avoids needing a direct data communication link between the RF signal generator control system 509 and the impedance matching system 215A.

In some embodiments, the RF signal generator control system 581 of the high frequency RF signal generator 502 is operable to send data conveying a gamma/power ratio control capacitor 224A position command to the gamma/power ratio capacitor control system 225A within the impedance matching system 215A, by way of the control module 163. Also, the gamma/power ratio capacitor control system 225A is operable to send data conveying a gamma/power ratio control capacitor 224A position readback to the RF signal generator control system 581, by way of the control module 163. It should be understood that from the viewpoint of the RF signal generator control system 581, the RF signal generator control system 581 is in data communication with the control module 163. Also, it should be understood that from the viewpoint of the impedance matching system 215A, the impedance matching system 215A is in data communication with the control module 163. The control module 163 is programmed to moderate data communication between the RF signal generator control system 581 and the impedance matching system 215A. In this manner, the RF signal generator control system 581 is configured and programmed to communicate directly with the control module 163, but does not need to be configured and programmed to communicate directly with the impedance matching system 215A. Similarly, the impedance matching system 215A is configured and programmed to communicate directly with the control module 163, but does not need to be configured and programmed to communicate directly with the RF signal generator control system 581. The control module 163 is effectively configured and programmed to provide a data communication conduit between the RF signal generator control system 581 and the impedance matching system 215A, which avoids needing a direct data communication link between the RF signal generator control system 581 and the impedance matching system 215A.

During operation of the plasma processing system 100A/ 100B, the RF signal supply system 201A operates to generate and transmit RF signals through the impedance matching system 215A to the plasma processing system 100A/ 100B to generate the plasma 123. A voltage sensor 595 is connected to the output 223 of the impedance matching system 215A. The voltage sensor 595 is configured to measure the real-time voltage at the output 223 of the impedance matching system 215A, and transmit a signal indicating the real-time voltage at the output 223 of the impedance matching system 215A through a connection 597 to the control system 581 of the high frequency RF signal generator 502. The connection 597 is referred to as a primary voltage synchronization connection. Also, the connection 599 between the control system 581 of the high frequency RF signal generator 502 and the control system 509 of the low frequency RF signal generator 501 is referred to as a secondary voltage synchronization connection.

In some embodiments, the voltage sensor 595 operates to measure the time-varying voltage present at the output 223 of the impedance matching system 215A and transmit signals indicating the measured the time-varying voltage to the RF signal generator control system 581 through the connection 597. The RF signal generator control system 581 operates to analyze the time-varying voltage at the output 223 of the impedance matching system 215A, as provided by the voltage sensor 595, to determine the NTPRP ratio and/or the NTPDP ratio. At the same time, the RF signal generator control system 581 is aware of the current setting of the gamma/power ratio control capacitor 224A within the impedance matching system 215A, by way of the gamma/ power ratio control capacitor 224A position readback signal received at the RF signal generator control system 581 from the gamma/power ratio capacitor control system 225A within the impedance matching system 215A, by way of the control module 163.

Figure 6:
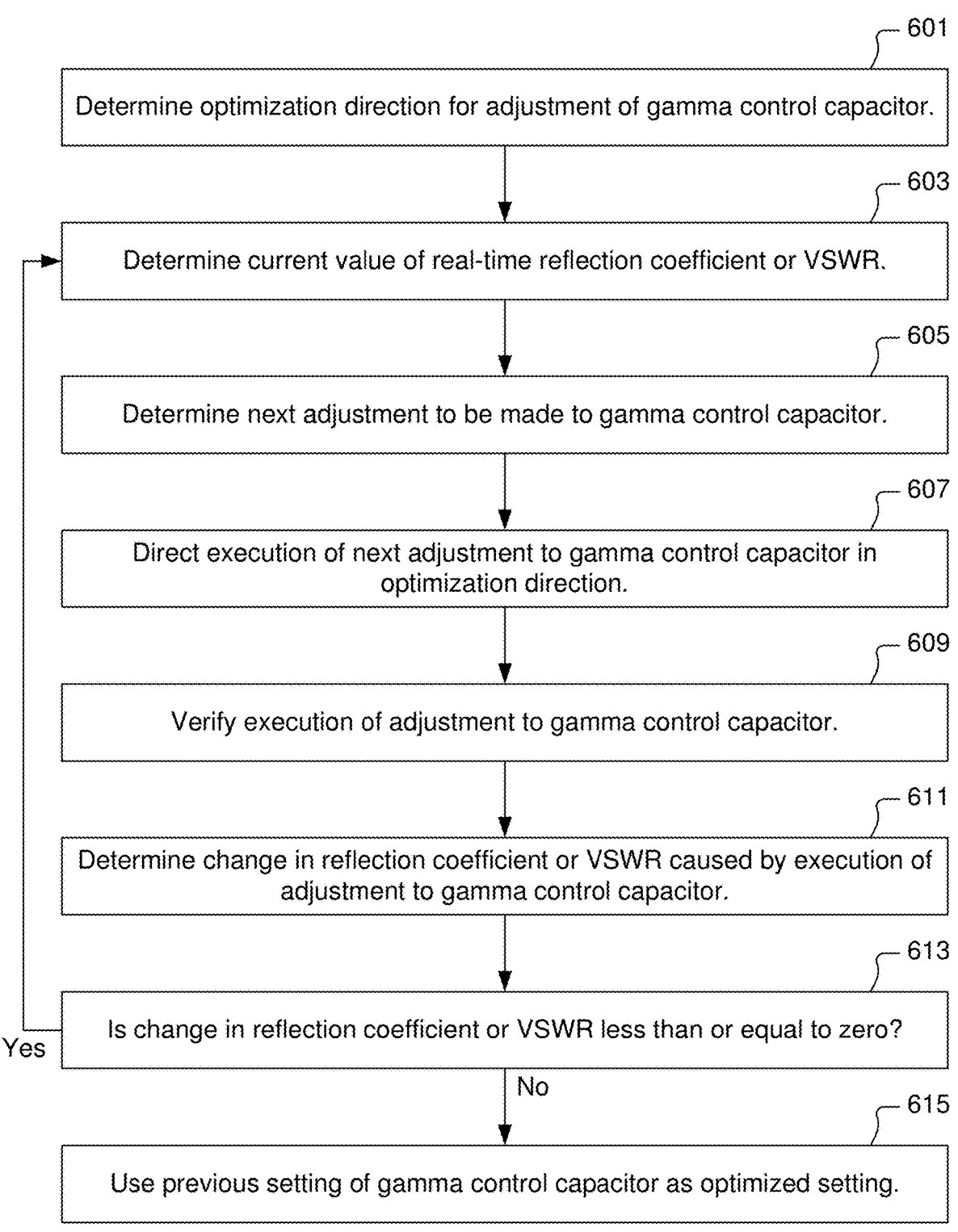
FIG. 6 shows a flowchart of a method for operating the RF signal generator control system to direct systematic adjustment of the gamma control capacitor to minimize the real-time reflection coefficient or VSWR, in accordance with some embodiments.

FIG. 6 shows a flowchart of a method for operating the RF signal generator control system 209 to direct systematic adjustment of the gamma control capacitor 224 to minimize the real-time reflection coefficient or VSWR, in accordance with some embodiments. The method includes an operation 601 for determining an optimization direction for adjustment of the gamma control capacitor 224, where the optimization direction is either an increase in capacitance of the gamma control capacitor 224, or a decrease in capacitance of the gamma control capacitor 224, that causes a reduction in the real-time reflection coefficient or VSWR. The method then proceeds with an operation 603 for determining a current value of the real-time reflection coefficient or VSWR at the output 210 of the RF signal generator 201. Operation 603 is performed by the RF signal generator control system 209 using the time-varying voltage measured by the V/I sensor 207 at the output 210 of the RF signal generator 201.

From the operation 603, the method proceeds with an operation 605 for determining a next adjustment to be made to the gamma control capacitor 224 in the optimization direction determined in operation 601. The operation 605 is performed by the RF signal generator control system 209. In some embodiments, the amount of adjustment to be made to the gamma control capacitor 224 in the optimization direction can be controlled/set through an external input to the RF signal generator control system 209. In some embodiments, the amount of adjustment to be made to the gamma control capacitor 224 in the optimization direction can be determined in real-time by the RF signal generator control system 209. For example, in some embodiments, the RF signal generator control system 209 determines and uses a rate of change of the reflection coefficient or VSWR with respect to capacitance of the gamma control capacitor 224 to determine the amount of adjustment to be made to the gamma control capacitor 224.

From the operation 605, the method proceeds with an operation 607 for directing execution of the next adjustment to the gamma control capacitor as determined in operation 605. The operation 607 is performed by the RF signal generator control system 209 operating to transmit data conveying the gamma control capacitor position command to the gamma capacitor control system 225 within the impedance matching system 215, by way of the control module 163. The method then proceeds with an operation 609 for verifying execution of the adjustment to the gamma control capacitor 224. The operation 609 is performed by the gamma capacitor control system 225 operating to send data conveying the gamma control capacitor position readback to the RF signal generator control system 209, by way of the control module 163.

Following operation 609, the method proceeds with an operation 611 for determining a change in reflection coefficient or VSWR caused by execution of the adjustment to the gamma control capacitor 224 in operation 607. Operation 611 is performed by the RF signal generator control system 209 using the time-varying voltage measured by the V/I sensor 207 at the output 210 of the RF signal generator 201 to determine a modified value of the reflection coefficient or VSWR caused by execution of the adjustment to the gamma control capacitor 224 in operation 607. The previous value of the reflection coefficient or VSWR corresponding to the previous setting of the gamma control capacitor 607 (before performing operation 607) is subtracted from the modified value of the reflection coefficient or VSWR (after performing operation 607) to determine the change in reflection coefficient or VSWR caused by execution of the adjustment to the gamma control capacitor 224 in operation 607.

From the operation 611, the method proceeds with an operation 613 to determine whether or not the change in reflection coefficient or VSWR as determined in operation 611 is less than or equal to zero. If the change in reflection coefficient or VSWR is determined to be less than or equal to zero in operation 613, the method reverts back to operation 603 to determine the next adjustment to be made to the gamma control capacitor 224 in the optimization direction. However, if the change in reflection coefficient or VSWR is determined to be greater than zero in operation 613, the method proceeds with an operation 615 in which the previous setting of the gamma control capacitor 224 is determined to be the optimized setting of the gamma control capacitor 224, where the previous setting of the gamma control capacitor 224 existed immediately prior to the last performance of operation 607. Operations 613 and 615 are performed by the RF signal generator control system 209.

In the method of FIG. 6, the RF signal generator control system 209 operates to determine an adjustment to be made to the gamma control capacitor 224, and sends a corresponding control signal through the control module 163 to the gamma capacitor control system 225 within the impedance matching system 215 to effect execution of the adjustment to the gamma control capacitor 224. The adjustment to the gamma control capacitor 224 is made in the optimization direction that initially causes a reduction in the real-time reflection coefficient or VSWR. The RF signal generator control system 209 then determines whether or not the executed adjustment to the gamma control capacitor 224 caused a reduction of the real-time reflection coefficient or VSWR.

If the executed adjustment to the gamma control capacitor 224 did cause a reduction of the real-time reflection coefficient or VSWR value, the RF signal generator control system 209 operates to determine a further adjustment to be made to the gamma control capacitor 224, and sends a corresponding control signal through the control module 163 to the gamma capacitor control system 225 to execute the further adjustment to the gamma control capacitor 224. The RF signal generator control system 209 then determines whether or not the executed further adjustment to the gamma control capacitor 224 caused a further reduction of the real-time reflection coefficient or VSWR. This process of operating the RF signal generator control system 209 to adjust the gamma control capacitor 224 and determine the corresponding effect on the real-time reflection coefficient or VSWR continues until an increase in the real-time reflection coefficient or VSWR is determined relative to an immediately prior determined value of the real-time reflection coefficient or VSWR, thereby indicating that the immediately prior determined value of the real-time reflection coefficient or VSWR is a minimum achievable value, and thereby indicating that the immediately prior setting of the gamma control capacitor 224 is the optimal setting.

In some embodiments, the method of FIG. 6 is performed multiple times, with a decreased fixed amount of gamma control capacitor 224 adjustment executed in operation 605 each time the method of FIG. 6 is performed, and with the optimized gamma control capacitor 224 setting determined in operation 615 of a given run of the method of FIG. 6 used as the starting gamma control capacitor 224 setting for the next run of the method of FIG. 6. By decreasing the fixed amount of gamma control capacitor 224 adjustment executed in operation 605 each time the method of FIG. 6 is performed in sequence, a coarse-to-fine search algorithm is executed over the multiple runs of the method of FIG. 6 to find the optimized gamma control capacitor 224 that provides the minimum achievable reflection coefficient or VSWR.

Figure 7:
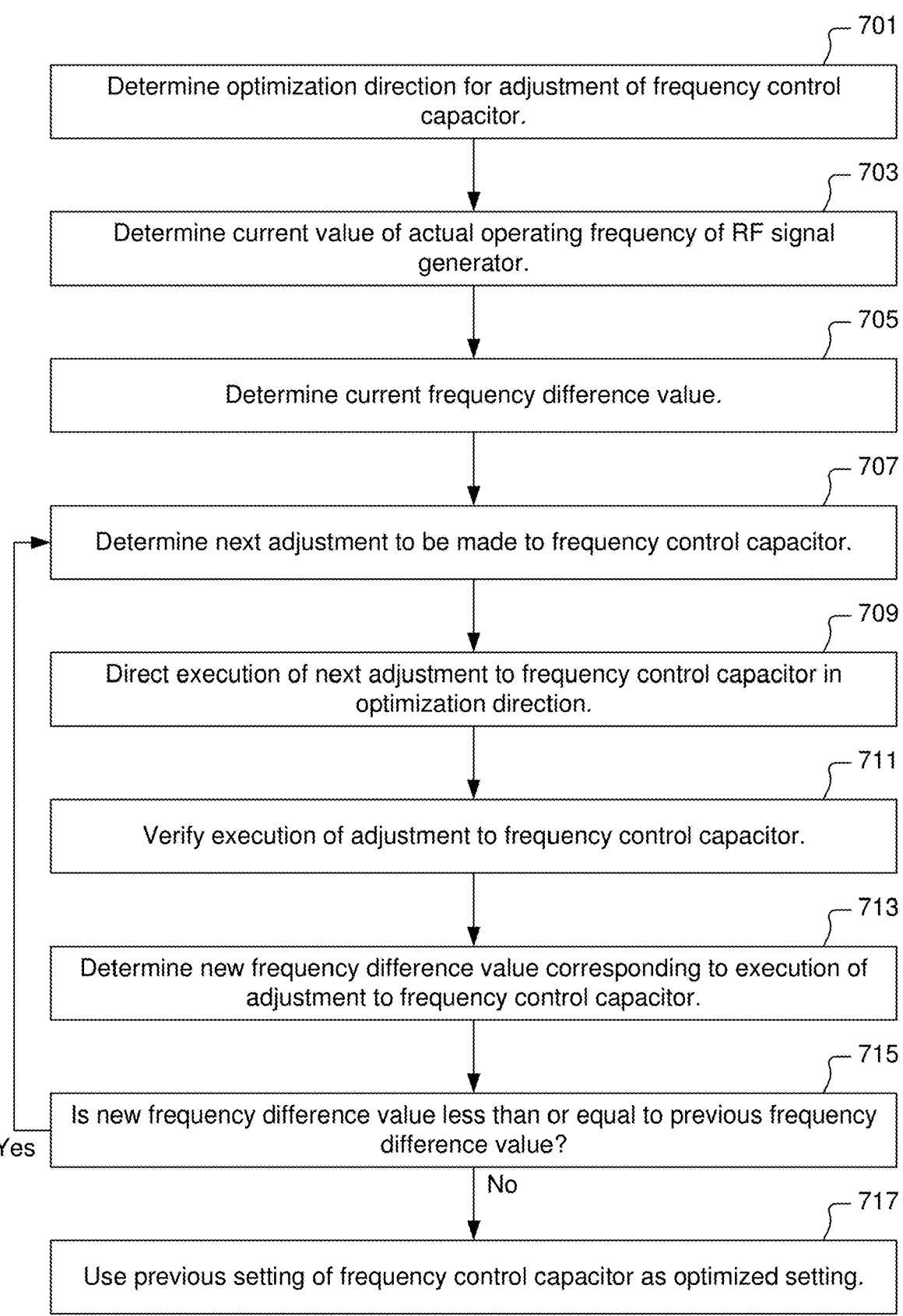
FIG. 7 shows a flowchart of a method for operating the RF signal generator control system to direct systematic adjustment of the frequency control capacitor to minimize the difference between the actual operating frequency of the RF signal generator and the target operating frequency of the RF signal generator, in accordance with some embodiments.

FIG. 7 shows a flowchart of a method for operating the RF signal generator control system 209 to direct systematic adjustment of the frequency control capacitor 230 to minimize the difference between the actual operating frequency of the RF signal generator 201 and the target operating frequency of the RF signal generator 201, in accordance with some embodiments. The method includes an operation 701 for determining an optimization direction for adjustment of the frequency control capacitor 230, where the optimization direction is either an increase in capacitance of the frequency control capacitor 230, or a decrease in capacitance of the frequency control capacitor 230, that causes a reduction in the difference between the actual operating frequency of the RF signal generator 201 and the target operating frequency of the RF signal generator 201. The method then proceeds with an operation 703 for determining a current value of the actual operating frequency of the RF signal generator 201. Operation 703 is performed by the RF signal generator control system 209. From the operation 703, the method proceeds with an operation 705 for determining a current frequency difference value, where the frequency difference value is defined as the absolute value of the difference between the actual operating frequency of the RF signal generator 201 and the target operating frequency of the RF signal generator 201.

From the operation 705, the method proceeds with an operation 707 for determining a next adjustment to be made to the frequency control capacitor 230 in the optimization direction determined in operation 701. The operation 707 is performed by the RF signal generator control system 209. In some embodiments, the amount of adjustment to be made to the frequency control capacitor 230 in the optimization direction can be controlled/set through an external input to the RF signal generator control system 209. In some embodiments, the amount of adjustment to be made to the frequency control capacitor 230 in the optimization direction can be determined in real-time by the RF signal generator control system 209. For example, in some embodiments, the RF signal generator control system 209 determines and uses a rate of change of the frequency difference value with respect to capacitance of the frequency control capacitor 230 to determine the amount of adjustment to be made to the frequency control capacitor 230.

From the operation 707, the method proceeds with an operation 709 for directing execution of the next adjustment to the frequency control capacitor 230 as determined in operation 707. The operation 709 is performed by the RF signal generator control system 209 operating to transmit data conveying the frequency control capacitor position command to the frequency capacitor control system 231 within the impedance matching system 215, by way of the control module 163. The method then proceeds with an operation 711 for verifying execution of the adjustment to the frequency control capacitor 230. The operation 711 is performed by the frequency capacitor control system 231 operating to send data conveying the frequency control capacitor position readback to the RF signal generator control system 209, by way of the control module 163.

Following operation 711, the method proceeds with an operation 713 for determining a new frequency difference value corresponding to execution of the adjustment to the frequency control capacitor 230 in operation 709. In operation 713, the RF signal generator control system 209 computes the new frequency difference value as the absolute value of the difference between the actual operating frequency of the RF signal generator 201 and the target operating frequency of the RF signal generator 201 following performance of operation 709. Operation 713 is performed by the RF signal generator control system 209.

From the operation 713, the method proceeds with an operation 715 to determine whether or not the new frequency difference value as determined in operation 713 is less than or equal to the previous frequency difference value that existed before performance of operation 709. If the new frequency difference value is determined to be less than or equal to the previous frequency difference value, the method reverts back to operation 707 to determine the next adjustment to be made to the frequency control capacitor 230 in the optimization direction. However, if the new frequency difference value is determined to be greater than the previous frequency difference value, the method proceeds with an operation 717 in which the previous setting of the frequency control capacitor 230 is determined to be the optimized setting of the frequency control capacitor 230, where the previous setting of the frequency control capacitor 230 existed immediately prior to the last performance of operation 709. Operation 715 is performed by the RF signal generator control system 209.

In the method of FIG. 7, the RF signal generator control system 209 operates to determine an adjustment to be made to the frequency control capacitor 230, and sends a corresponding control signal through the control module 163 to the frequency capacitor control system 231 within the impedance matching system 215 to execute the adjustment to the frequency control capacitor 230. The adjustment to the frequency control capacitor 230 is made in the optimization direction that initially causes a reduction in the frequency difference value. The RF signal generator control system 209 then determines whether or not the executed adjustment to the frequency control capacitor 230 caused a reduction of the frequency difference value.

If the executed adjustment to the frequency control capacitor 230 did cause a reduction of the frequency difference value, the RF signal generator control system 209 operates to determine a further adjustment to be made to the frequency control capacitor 230, and sends a corresponding control signal through the control module 163 to the frequency capacitor control system 231 to execute the further adjustment to the frequency control capacitor 230. The RF signal generator control system 209 then determines whether or not the executed further adjustment to the frequency control capacitor 230 caused a further reduction of the frequency difference value. This process of operating the RF signal generator control system 209 to adjust the frequency control capacitor 230 and determine the corresponding effect on the frequency difference value continues until an increase in the frequency difference value is determined relative to an immediately prior determined frequency difference value, thereby indicating that the immediately prior determined frequency difference value is a minimum achievable value, and thereby indicating that the immediately prior setting of the frequency control capacitor 230 is the optimal setting.

In some embodiments, the method of FIG. 7 is performed multiple times, with a decreased fixed amount of frequency control capacitor 230 adjustment executed in operation 707 each time the method of FIG. 7 is performed, and with the optimized frequency control capacitor 230 setting determined in operation 707 of a given run of the method of FIG. 7 used as the starting frequency control capacitor 230 setting for the next run of the method of FIG. 7. By decreasing the fixed amount of frequency control capacitor 230 adjustment executed in operation 707 each time the method of FIG. 7 is performed in sequence, a coarse-to-fine search algorithm is executed over the multiple runs of the method of FIG. 7 to find the optimized frequency control capacitor 230 setting that provides the minimum achievable frequency difference value, i.e., that provides the minimum difference between the actual operating frequency of the RF signal generator 201 and the target operating frequency of the RF signal generator 201.

In some embodiments, the methods of FIGS. 6 and 7 are performed in conjunction with each other. More specifically, in some embodiments, the method of FIG. 6 is performed to determine the optimum setting of the gamma control capacitor 224 that minimizes the reflection coefficient and/or VSWR. Then, the method of FIG. 7 is performed to determine the optimum setting of the frequency control capacitor 230 that minimizes the difference between the actual frequency of signals generated by the RF signal generator 201 and a target frequency. Because adjustment of the frequency control capacitor 230 can impact the optimum setting of the gamma control capacitor 224, and vice-versa, the methods of FIGS. 6 and 7 can be iteratively performed in a sequential manner until optimized settings of both the gamma control capacitor 224 and the frequency control capacitor 230 are achieved. In other words, the method of FIG. 6 is performed, followed by the method of FIG. 7. Then, the sequential performance of the methods of FIGS. 6 and 7 is repeated until optimized settings of both the gamma control capacitor 224 and the frequency control capacitor 230 are achieved.

In some embodiments, once the methods of FIGS. 6 and 7 are performed to optimize the settings of both the gamma control capacitor 224 and the frequency control capacitor 230, the RF signal generator 201 is operated with the optimized settings of the gamma control capacitor 224 and the frequency control capacitor 230 until a retune condition is detected. Then, upon detecting the retune condition, the methods of FIGS. 6 and 7 are repeated to re-establish the optimized settings of both the gamma control capacitor 224 and the frequency control capacitor 230. In some embodiments, the retune condition exists when the real-time reflection coefficient and/or VSWR at the output of the RF signal generator 201, as determined by the RF signal generator control system 209, changes by a threshold amount. In some embodiments, the threshold amount of change in the real-time reflection coefficient that triggers the retune condition is 0.01. However, in various embodiments, the threshold amount of change in the real-time reflection coefficient that triggers the retune condition can be either greater than 0.01 or less than 0.01. Similarly, in some embodiments, a threshold amount of change in the real-time frequency difference value triggers the retune condition, where the real-time frequency difference value is continuously determined by the RF signal generator control system 209. In some embodiments, the threshold amount of change in the frequency difference value that triggers the retune condition is +/−5 kHz. In some embodiments, the threshold amount of change in the frequency difference value that triggers the retune condition is +/−50 kHz. In some embodiments, the threshold amount of change in the frequency difference value that triggers the retune condition is +/−100 kHz.

The GBMC system 200 is a RF signal supply system for plasma generation. The GBMC system 200 includes the RF signal generator 201 configured to generate RF signals and transmit the RF signals through the output 210 of the RF signal generator 201. The RF signal generator 201 includes the RF signal generator control system 209. The GMBC system 200 also includes the impedance matching system 215 having the input 217 electrically connected to the output 210 of the RF signal generator 201. The impedance matching system 215 has the output 223 connected to the RF feed structure 109 of the plasma processing system 100A/100B. The impedance matching system 215 includes the gamma control capacitor 224 connected between the input 217 of the impedance matching system 215 and the reference potential 227. The impedance matching system 215 includes the frequency control capacitor 230 connected between the terminal of the inductor 229 (also referred to as first inductor 229) and the reference potential 227. The first inductor 229 has another terminal connected to the output 223 of the impedance matching system 215. The GBMC system 200 also includes the control module 163 connected in data communication with each of the RF signal generator 201 and the impedance matching system 215. The control module 163 is programmed to transmit control signals to the impedance matching system 215 based on corresponding data received from the RF signal generator control system 209, where the control signals direct control of the gamma control capacitor 224 and the frequency control capacitor 230. The control module 163 is also programmed to transmit data to the RF signal generator control system 209 based on corresponding data or signals received from the impedance matching system 215.

The gamma control capacitor 224 is a variable capacitor. The impedance matching system 215 includes the gamma capacitor control system 225 connected and configured to control the gamma control capacitor 224 in accordance with control signals received from the control module 163 that correspond to control signals generated by the RF signal generator control system 209. The frequency control capacitor 230 is a variable capacitor. The impedance matching system 215 includes the frequency capacitor control system 231 connected and configured to control the frequency control capacitor 230 in accordance with control signals received from the control module 163 that correspond to control signals generated by the RF signal generator control system 209. Each of the gamma capacitor control system 225 and the frequency capacitor control system 231 is connected in data communication with the network interface controller 239 within the impedance matching system 215. The impedance matching system 215 further includes the capacitor 219 and the inductor 221 (also referred to as second inductor 221) connected in series between the input 217 of the impedance matching system 215 and the output 223 of the impedance matching system 215.

The RF signal generator includes the voltage/current sensor 207 connected to the output 210 of the RF signal generator 201. The RF signal generator control system 209 is connected to receive voltage measurement data from the voltage/current sensor 207. The RF signal generator control system 209 is programmed to use the voltage measurement data received from the voltage/current sensor 207 to determine a real-time reflection coefficient at the output 210 of the RF signal generator 201. The RF signal generator control system 209 is programmed to determine an adjustment of the gamma control capacitor 224 within the impedance matching system 215 to minimize the real-time reflection coefficient at the output 210 of the RF signal generator 201. The RF signal generator control system 209 is programmed to transmit data to the control module 163 that directs execution of the determined adjustment of the gamma control capacitor 224. The control module 163 is programmed to direct the gamma capacitor control system 225 within the impedance matching system 215 to execute the determined adjustment of the gamma control capacitor 224.

The RF signal generator control system 209 is programmed to determine an actual frequency of signals generated by the RF signal generator 201. The RF signal generator control system 209 is programmed to determine an adjustment of the frequency control capacitor 230 within the impedance matching system 215 to minimize a difference between the actual frequency of signals generated by the RF signal generator 201 and a target frequency. The RF signal generator control system 209 is programmed to transmit data to the control module 163 that directs execution of the determined adjustment of the frequency control capacitor 230. The control module 163 is programmed to direct the frequency capacitor control system 231 within the impedance matching system 215 to execute the determined adjustment of the frequency control capacitor 230.

FIG. 8A shows a flowchart of a method for optimizing transmission of RF power to a plasma, in accordance with some embodiments. The method includes an operation 801 for transmitting RF signals from the RF signal generator 201 through the impedance matching system 215 to the plasma processing system 100A/100B. In some embodiments, operation 801 is performed by the RF signal generator 201. The method also includes an operation 803 for determining a real-time reflection coefficient (and/or VSWR) at the output 210 of the RF signal generator 201. In some embodiments, operation 803 is performed by the RF signal generator control system 209. In some embodiments, the method includes operating the voltage/current sensor 207 within the RF signal generator 201 to measure a time-varying voltage at the output 210 of the RF signal generator 201. The method then includes operating the RF signal generator control system 209 to use the measured time-varying voltage at the output 210 of the RF signal generator 201 to determine the real-time reflection coefficient (and/or VSWR) at the output 210 of the RF signal generator 201.

From the operation 803, the method proceeds with an operation 805 for determining an adjustment of the gamma control capacitor 224 within the impedance matching system 215 to adjust the real-time reflection coefficient (and/or VSWR) at the output 210 of the RF signal generator 201 toward a minimum value. In some embodiments, operation 805 is performed by the RF signal generator 201. The method also includes an operation 807 for transmitting gamma control data to the control module 163. In some embodiments, operation 807 is performed by the control system of the RF signal generator 201. The gamma control data directs execution of the determined adjustment of the gamma control capacitor 224. The method also includes an operation 809 for directing the impedance matching system 215 to execute the determined adjustment of the gamma control capacitor 224. In some embodiments, operation 809 is performed by the control module 163. The method further includes an operation 811 for repeating operations 803, 805, 807, and 809 until the real-time reflection coefficient (and/or VSWR) at the output 210 of the RF signal generator 201 has reached a minimum achievable value.

In some embodiments, the method includes operating the gamma capacitor control system 225 within the impedance matching system 215 to receive gamma control signals from the control module 163. The gamma control signals direct execution of the adjustment of the gamma control capacitor 224 as determined in operation 805. The method further includes operating the gamma capacitor control system 225 to adjust a capacitance setting of the gamma control capacitor 224 in accordance with the gamma control signals. In some embodiments, the method includes operating the gamma capacitor control system 225 to transmit data conveying a current setting of the gamma control capacitor 224 to the control module 163. The control module 163 operates to transmit the data conveying the current setting of the gamma control capacitor 224 to the RF signal generator control system 209.

FIG. 8B shows a flowchart of a continuation of the method of FIG. 8A for optimizing transmission of RF power to the plasma, in accordance with some embodiments. The method includes an operation 813 for determining a frequency difference value, where the frequency difference value is an absolute value of a difference between an actual frequency of RF signals generated by the RF signal generator 201 and a target frequency. In some embodiments, operation 813 is performed by the RF signal generator control system 209. The method also includes an operation 815 for determining an adjustment of the frequency control capacitor 230 within the impedance matching system 215 that adjusts the frequency difference value toward a minimum value. In some embodiments, operation 815 is performed by the RF signal generator control system 209. The method also includes an operation 817 for transmitting frequency control data to the control module 163, where the frequency control data directs execution of the determined adjustment of the frequency control capacitor 230. In some embodiments, operation 817 is performed by the RF signal generator control system 209. The method also includes an operation 819 for directing the impedance matching system 215 to execute the determined adjustment of the frequency control capacitor 230. In some embodiments, operation 819 is performed by the control module 163. The method further includes an operation 821 for repeating operations 813, 815, 817, and 819 until the frequency difference value has reached a minimum achievable value.

In some embodiments, the method includes operating the frequency capacitor control system 231 within the impedance matching system 215 to receive frequency control signals from the control module 163, where the frequency control signals direct execution of the determined adjustment of the frequency control capacitor 230. The method also includes operating the frequency capacitor control system 231 to adjust a capacitance setting of the frequency control capacitor 230 in accordance with the frequency control signals. In some embodiments, the method includes operating the frequency capacitor control system 231 to transmit data conveying a current setting of the frequency control capacitor 230 to the control module 163. The method also includes operating the control module 163 to transmit the data conveying the current setting of the frequency control capacitor 230 to the RF signal generator control system 209.

FIG. 9 shows a flowchart of a method for optimizing transmission of RF power to a plasma, in accordance with some embodiments. The method includes an operation 901 for operating both the low frequency RF signal generator 501 and the high frequency RF signal generator 502 of the RF signal supply system 201A to generate and transmit RF signals through the impedance matching system 215A to the plasma processing system 100A/100B in accordance with the frequency tuning process described with regard to FIG. 5C. The method also includes an operation 903 for determining a real-time value for the NTPRP ratio. In some embodiments, operation 903 is performed by the RF signal generator control system 509 and/or the RF signal generator control system 581. In some embodiments, the method also includes operating the voltage sensor 595 to measure a time-varying voltage at the output 223 of the impedance matching system 215A. The method then includes operating the RF signal generator control system 581 to use the measured time-varying voltage at the output 223 of the impedance matching system 215A to determine the real-time value of the NTPRP ratio.

From the operation 903, the method proceeds with an operation 905 for determining an adjustment of the gamma/power ratio control capacitor 224A within the impedance matching system 215A to adjust the real-time value of the NTPRP ratio toward a target value. In some embodiments, operation 905 is performed by the low frequency RF signal generator 501 and/or the high frequency RF signal generator 502. The method also includes an operation 907 for transmitting gamma/power ratio control data to the control module 163. In some embodiments, operation 907 is performed by the RF signal generator control system 509 of the low frequency RF generator 501 and/or the RF signal generator control system 581 of the high frequency RF signal generator 502. The gamma/power ratio control data directs execution of the determined adjustment of the gamma/power ratio control capacitor 224A. The method also includes an operation 909 for directing the impedance matching system 215A to execute the determined adjustment of the gamma/power ratio control capacitor 224A. In some embodiments, operation 909 is performed by the control module 163. The method further includes an operation 911 for repeating operations 903, 905, 907, and 909 until a difference between the real-time value of the NTPRP ratio and the corresponding target value reaches a minimum achievable value. In some embodiments, the method of FIG. 7B for optimizing transmission of RF power to the plasma is performed after the method of FIG. 9.

In some embodiments, the method includes operating the gamma/power ratio capacitor control system 225A within the impedance matching system 215A to receive gamma/power ratio control signals from the control module 163. The gamma/power ratio control signals direct execution of the adjustment of the gamma/power ratio control capacitor 224A as determined in operation 905. The method further includes operating the gamma/power ratio capacitor control system 225A to adjust a capacitance setting of the gamma/power ratio control capacitor 224A in accordance with the gamma/power ratio control signals. In some embodiments, the method includes operating the gamma/power ratio capacitor control system 225A to transmit data conveying a current setting of the gamma/power ratio control capacitor 224A to the control module 163. The control module 163 operates to transmit the data conveying the current setting of the gamma/power ratio control capacitor 224A to the RF signal generator control system 509 within the low frequency RF signal generator 501 and/or to the RF signal generator control system 581 within the high frequency RF signal generator 502.

Figure 10:
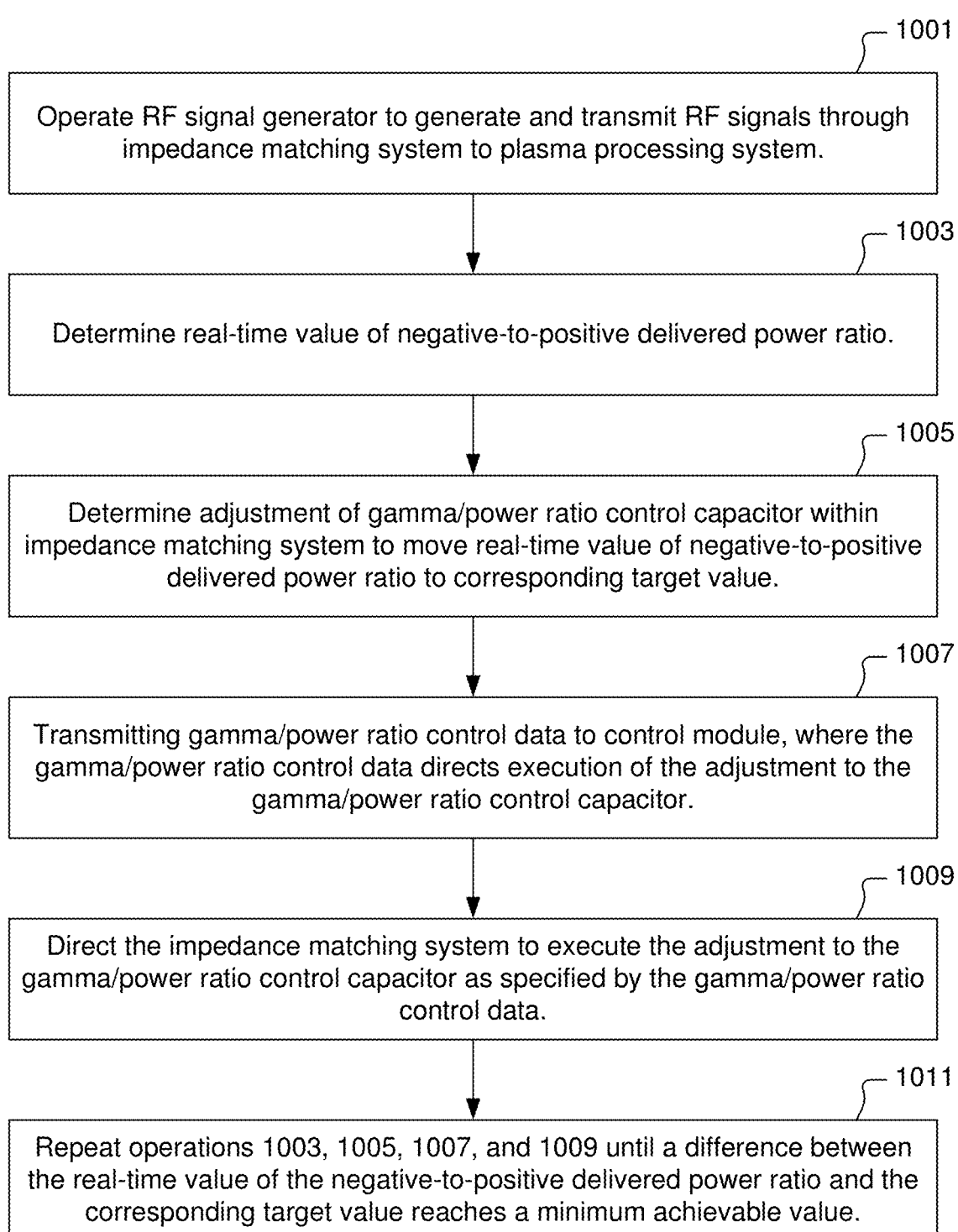
FIG. 10 shows a flowchart of a method for optimizing transmission of RF power to a plasma, in accordance with some embodiments.

FIG. 10 shows a flowchart of a method for optimizing transmission of RF power to a plasma, in accordance with some embodiments. The method includes an operation 1001 for operating both the low frequency RF signal generator 501 and the high frequency RF signal generator 502 of the RF signal supply system 201A to generate and transmit RF signals through the impedance matching system 215A to the plasma processing system 100A/100B in accordance with the frequency tuning process described with regard to FIG. 5C. The method also includes an operation 1003 for determining a real-time value for the NTPDP ratio. In some embodiments, operation 1003 is performed by the RF signal generator control system 509 and/or the RF signal generator control system 581. In some embodiments, the method includes operating the voltage sensor 595 to measure a time-varying voltage at the output 223 of the impedance matching system 215A. The method then includes operating the RF signal generator control system 581 to use the measured time-varying voltage at the output 223 of the impedance matching system 215A to determine the real-time value of the NTPDP ratio.

From the operation 1003, the method proceeds with an operation 1005 for determining an adjustment of the gamma/power ratio control capacitor 224A within the impedance matching system 215A to adjust the real-time value of the NTPDP ratio toward a target value. In some embodiments, operation 1005 is performed by the low frequency RF signal generator 501 and/or the high frequency RF signal generator 502. The method also includes an operation 1007 for transmitting gamma/power ratio control data to the control module 163. In some embodiments, operation 1007 is performed by the RF signal generator control system 509 of the low frequency RF generator 501 and/or the RF signal generator control system 581 of the high frequency RF signal generator 502. The gamma/power ratio control data directs execution of the determined adjustment of the gamma/power ratio control capacitor 224A. The method also includes an operation 1009 for directing the impedance matching system 215A to execute the determined adjustment of the gamma/power ratio control capacitor 224A. In some embodiments, operation 1009 is performed by the control module 163. The method further includes an operation 1011 for repeating operations 1003, 1005, 1007, and 1009 until a difference between the real-time value of the NTPDP ratio and the corresponding target value reaches a minimum achievable value. In some embodiments, the method of FIG. 7B for optimizing transmission of RF power to the plasma is performed after the method of FIG. 10.

In some embodiments, the method includes operating the gamma/power ratio capacitor control system 225A within the impedance matching system 215A to receive gamma/power ratio control signals from the control module 163. The gamma/power ratio control signals direct execution of the adjustment of the gamma/power ratio control capacitor 224A as determined in operation 1005. The method further includes operating the gamma/power ratio capacitor control system 225A to adjust a capacitance setting of the gamma/power ratio control capacitor 224A in accordance with the gamma/power ratio control signals. In some embodiments, the method includes operating the gamma/power ratio capacitor control system 225A to transmit data conveying a current setting of the gamma/power ratio control capacitor 224A to the control module 163. The control module 163 operates to transmit the data conveying the current setting of the gamma/power ratio control capacitor 224A to the RF signal generator control system 509 within the low frequency RF signal generator 501 and/or to the RF signal generator control system 581 within the high frequency RF signal generator 502.

It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A radiofrequency signal supply system for plasma generation, comprising:

a radiofrequency signal generator configured to generate radiofrequency signals and transmit the radiofrequency signals through an output of the radiofrequency signal generator, the radiofrequency signal generator including a control system configured to determine a real-time value of an indicator parameter indicative of an efficacy of transmission of radiofrequency power to a plasma processing system, wherein the indicator parameter is one or more of a radiofrequency signal reflection coefficient, a negative-to-positive reflected power ratio, and a negative-to-positive delivered power ratio;

an impedance matching system having an input connected to the output of the radiofrequency signal generator, an output connected to a radiofrequency feed structure of a plasma processing system, a first control capacitor connected between the input of the impedance matching system and a reference potential, and a second control capacitor connected between a first terminal of a first inductor and the reference potential, the first inductor having a second terminal connected to the output of the impedance matching system; and a control module connected in data communication with each of the radiofrequency signal generator and the impedance matching system, the control module configured to generate control signals for the impedance matching system based on the real-time value of the indicator parameter determined by the control system of the radiofrequency signal generator, the control signals directing control of the first control capacitor and the second control capacitor to cause movement of the real-time value of the indicator parameter toward a corresponding target value, the control module programmed to transmit the control signals to the control system of the radiofrequency signal generator.

2. The radiofrequency signal supply system for plasma generation as recited in claim 1, wherein the first control capacitor is a first variable capacitor, the impedance matching system including a gamma capacitor control system configured to control the first control capacitor in accordance with control signals received from the control module, and wherein the second control capacitor is a second variable capacitor, the impedance matching system including a frequency capacitor control system configured to control the second control capacitor in accordance with control signals received from the control module.

3. The radiofrequency signal supply system for plasma generation as recited in claim 2, wherein each of the gamma capacitor control system and the frequency capacitor control system is connected in data communication with a network interface controller within the impedance matching system.

4. The radiofrequency signal supply system for plasma generation as recited in claim 2, wherein the impedance matching system further includes a capacitor and a second inductor connected in series between the input and the output of the impedance matching system.

5. The radiofrequency signal supply system for plasma generation as recited in claim 2, wherein the radiofrequency signal generator includes a voltage/current sensor connected to the output of the radiofrequency signal generator, the control system of the radiofrequency signal generator connected to receive voltage measurement data from the voltage/current sensor.

6. The radiofrequency signal supply system for plasma generation as recited in claim 5, wherein the control system of the radiofrequency signal generator is programmed to use the voltage measurement data received from the voltage/current sensor to determine a real-time reflection coefficient at the output of the radiofrequency signal generator, and wherein the control system of the radiofrequency signal generator is programmed to determine an adjustment of the first control capacitor within the impedance matching system to minimize the real-time reflection coefficient at the output of the radiofrequency signal generator, the control system of the radiofrequency signal generator programmed to transmit data to the control module that directs execution of the determined adjustment of the first control capacitor, the control module programmed to direct the gamma capacitor control system to execute the determined adjustment of the first control capacitor.

7. The radiofrequency signal supply system for plasma generation as recited in claim 2, wherein the control system of the radiofrequency signal generator is programmed to determine an actual frequency of signals generated by the radiofrequency signal generator, determine an adjustment of the second control capacitor within the impedance matching system to minimize a difference between the actual frequency and a target frequency, and transmit data to the control module that directs execution of the determined adjustment of the second control capacitor, the control module programmed to direct the frequency capacitor control system to execute the determined adjustment of the second control capacitor.

8. The radiofrequency signal supply system for plasma generation as recited in claim 1, wherein the first control capacitor is a first variable capacitor, the impedance matching system including a gamma/power ratio capacitor control system connected and configured to control the first control capacitor in accordance with control signals received from the control module, wherein the second control capacitor is a second variable capacitor, the impedance matching system including a frequency capacitor control system connected and configured to control the second control capacitor in accordance with control signals received from the control module, wherein the control system of the radiofrequency signal generator is programmed to determine a real-time value of a negative-to-positive reflected power ratio, determine an adjustment of the first control capacitor within the impedance matching system to minimize a difference between the real-time value of the negative-to-positive reflected power ratio and a corresponding target value, and transmit data to the control module that directs execution of the determined adjustment of the first control capacitor, the control module programmed to direct the gamma/power ratio capacitor control system to execute the determined adjustment of the first control capacitor.

9. The radiofrequency signal supply system for plasma generation as recited in claim 1, wherein the first control capacitor is a first variable capacitor, the impedance matching system including a gamma/power ratio capacitor control system connected and configured to control the first control capacitor in accordance with control signals received from the control module, wherein the second control capacitor is a second variable capacitor, the impedance matching system including a frequency capacitor control system connected and configured to control the second control capacitor in accordance with control signals received from the control module, wherein the control system of the radiofrequency signal generator is programmed to determine a real-time value of a negative-to-positive delivered power ratio, determine an adjustment of the first control capacitor within the impedance matching system to minimize a difference between the real-time value of the negative-to-positive delivered power ratio and a corresponding target value, and transmit data to the control module that directs execution of the determined adjustment of the first control capacitor, the control module programmed to direct the gamma/power ratio capacitor control system to execute the determined adjustment of the first control capacitor.

10. A method for optimizing transmission of radiofrequency power to a plasma, comprising:

(a) transmitting radiofrequency signals from a radiofrequency signal generator through an impedance matching system to a plasma processing system;

(b) determining a real-time value of an indicator parameter indicative of an efficacy of transmission of radiofrequency power to the plasma processing system, wherein the indicator parameter is one or more of a radiofrequency signal reflection coefficient, a negative-to-positive reflected power ratio, and a negative-to-positive delivered power ratio;

(c) determining an adjustment of a gamma control capacitor within the impedance matching system to adjust the real-time value of the indicator parameter with respect to a corresponding target value; and (d) transmitting gamma control data to effect execution of the determined adjustment of the gamma control capacitor.

11. The method as recited in claim 10, further comprising:

(e) repeating operations (b), (c), and (d) until a difference between the real-time value of the indicator parameter and the corresponding target value has reached a minimum achievable value.

12. The method as recited in claim 11, wherein the gamma control capacitor is connected between an input of the impedance matching system and a reference potential.

13. The method as recited in claim 11, further comprising: adjusting a capacitance setting of the gamma control capacitor in accordance with the gamma control data.

14. The method as recited in claim 11, further comprising: measuring a time-varying voltage at the output of the radiofrequency signal generator; and determining the real-time reflection coefficient at the output of the radiofrequency signal generator based on the measured time-varying voltage.

15. The method as recited in claim 11, further comprising:

(f) determining a frequency difference value, where the frequency difference value is an absolute value of a difference between an actual frequency of radiofrequency signals generated by the radiofrequency signal generator and a target frequency;

(g) determining an adjustment of a frequency control capacitor within the impedance matching system that adjusts the frequency difference value toward a minimum value; and (h) transmitting frequency control data to effect execution of the determined adjustment of the frequency control capacitor.

16. The method as recited in claim 15, further comprising:

(i) repeating operations (f), (g), and (h) until the frequency difference value has reached a minimum achievable value.

17. The method as recited in claim 16, further comprising:

receiving frequency control signals configured to direct execution of the determined adjustment of the frequency control capacitor; and adjusting a capacitance setting of the frequency control capacitor in accordance with the frequency control signals.

\* \* \* \* \*